(12) United States Patent
Nishimura et al.

(10) Patent No.: US 10,651,374 B2
(45) Date of Patent: May 12, 2020

(54) SEMICONDUCTOR DEVICE, AND METHOD FOR MANUFACTURING THE SAME

(71) Applicant: ROHM CO., LTD., Kyoto (JP)

(72) Inventors: Isamu Nishimura, Kyoto (JP); Hirofumi Takeda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/208,544

(22) Filed: Dec. 3, 2018

(65) Prior Publication Data
US 2019/0214555 A1 Jul. 11, 2019

(30) Foreign Application Priority Data

Dec. 4, 2017 (JP) .................................. 2017-232536
Nov. 29, 2018 (JP) .................................. 2018-223569

(51) Int. Cl.
*H01L 43/14* (2006.01)
*H01L 43/04* (2006.01)
*H01L 43/06* (2006.01)

(52) U.S. Cl.
CPC .............. *H01L 43/14* (2013.01); *H01L 43/04* (2013.01); *H01L 43/065* (2013.01); *H01L 2224/16* (2013.01); *H01L 2224/81192* (2013.01); *H01L 2924/181* (2013.01)

(58) Field of Classification Search
CPC ....... H01L 43/14; H01L 43/04; H01L 43/065; H01L 2224/16; H01L 2224/81192; H01L 2924/181; H01L 2924/00012; H01L 2224/13; H01L 21/563; H01L 23/4951; H01L 23/4952
See application file for complete search history.

(56) References Cited

U.S. PATENT DOCUMENTS

2008/0191227 A1* 8/2008 Kimura ................... H01L 33/62
257/98
2018/0076106 A1* 3/2018 Nishimura .......... H01L 21/4803

FOREIGN PATENT DOCUMENTS

JP 2003-328180 A 11/2003

* cited by examiner

*Primary Examiner* — Jasmine J Clark
(74) *Attorney, Agent, or Firm* — Rabin & Berdo, P.C.

(57) ABSTRACT

A semiconductor device includes a substrate having a front surface and a mounting surface that are separate from each other in a thickness direction. The substrate is formed with a through-hole that penetrates through in the thickness direction. A semiconductor element is mounted on the front surface of the substrate, and a front-surface wire line is formed on the front surface of the substrate to be electrically connected to the semiconductor element. A column is provided inside the through-hole, and is electrically connected to the front-surface wiring line. An electrode pad is provided on the mounting surface of the substrate, and is electrically connected to the column. A resin-layer through portion is also provided inside the through-hole. The semiconductor element is covered with a sealing resin. The resin-layer through portion has an orthogonal surface in contact with the column. The orthogonal surface is orthogonal to the mounting surface.

22 Claims, 23 Drawing Sheets

FIG.40

FIG.52
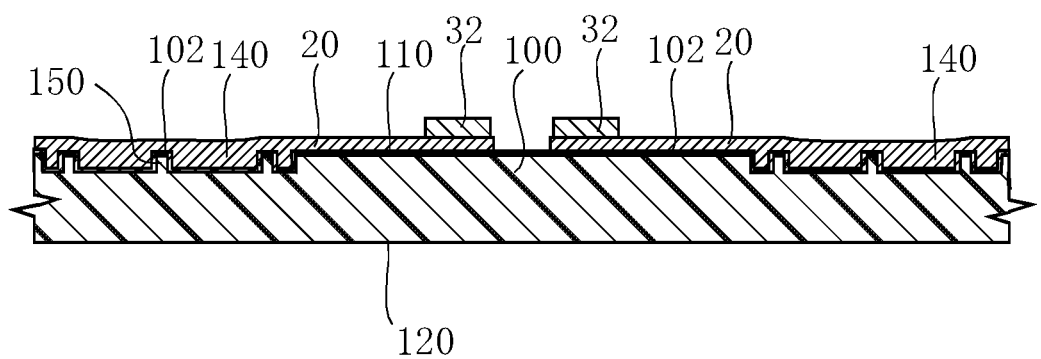
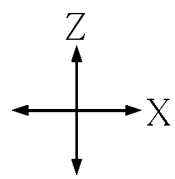
FIG.53
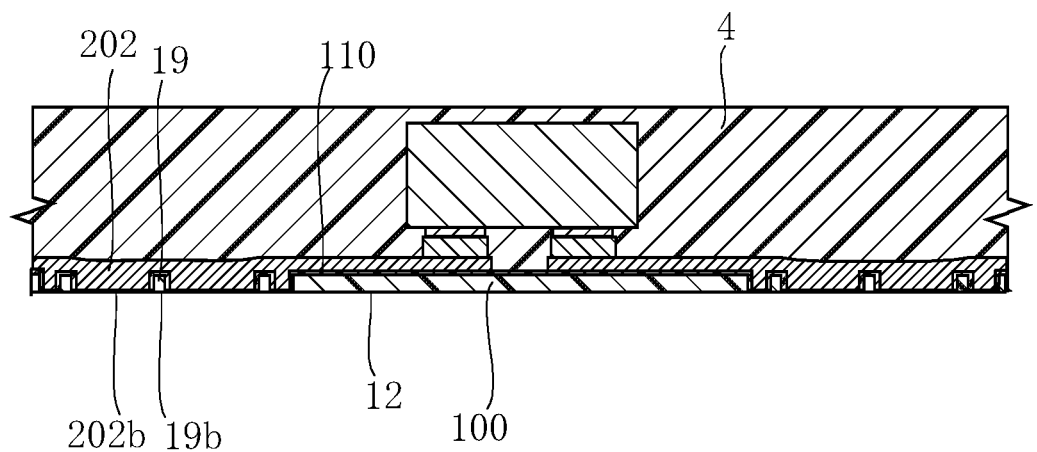
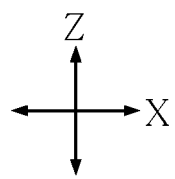

SEMICONDUCTOR DEVICE, AND METHOD FOR MANUFACTURING THE SAME

FIELD

The present disclosure relates to a semiconductor device in which a semiconductor element is mounted on a substrate, and a method for manufacturing the same.

BACKGROUND

In recent years, so-called micromachines (MEMS: Micro Electro Mechanical Systems) are becoming widespread. In these machines, various semiconductor elements are mounted on a microfabricated Si substrate (silicon wafer) using LSI manufacturing technology. During the manufacturing of such a micromachine, an electrode that penetrates a Si substrate may be provided. For example, JP-A-2003-328180 discloses a method for providing an electrode that penetrates a substrate. This method includes forming a bottomed via hole in a silicon wafer substrate, filling the bottomed via hole with Cu plating, and grinding the substrate from the surface located opposite from the opening of the bottomed via hole to expose the Cu plating.

In the case where single-wafer etching using plasma is employed as a method for forming a recess such as a bottomed via hole in a Si substrate, the processing cost increases due to the device cost and processing time. Batch etching using a chemical solution can reduce the processing cost. However, this method cannot form a recess having a side surface orthogonal to the Si substrate. For example, it is possible to form a recess in a monocrystal substrate by anisotropic etching from a (100) surface having a crystal orientation of (100). In this case, aside surface of the recess is a (111) surface, and forms an angle of approximately 55° with the (100) surface. When such a recess is filled with Cu plating to form an electrode and the substrate is ground from the surface opposite from the recess, variations occur in the area of the exposed portion of the electrode depending on the degree of grinding.

SUMMARY

The present disclosure has been proposed under the above-described circumstances, and an object thereof is to provide a semiconductor device capable of reducing variations in the area of the exposed portion of an electrode depending on the degree of grinding a substrate, and a method for manufacturing the same.

A first aspect of the present disclosure provides a semiconductor device. The semiconductor device includes: a substrate having a front surface, a mounting surface, and a through-hole, the front surface and the mounting surface facing opposite from each other in a thickness direction, the through-hole penetrating in the thickness direction; a semiconductor element mounted on the front surface; a front-surface wiring line formed on the front surface and electrically connected to the semiconductor element; a column formed within the through-hole and electrically connected to the front-surface wiring line; an electrode portion formed near the mounting surface and electrically connected to the column; and a sealing resin covering the semiconductor element.

In the implementation of the present disclosure, it is preferable that the semiconductor device further include a resin-layer through portion interposed between the column and an inner wall of the through-hole, wherein the resin-layer through portion is in contact with the column, and includes an orthogonal surface orthogonal to the mounting surface.

In the implementation of the present disclosure, it is preferable that cross sections of the through-hole parallel to the mounting surface be smaller in area toward the mounting surface.

In the implementation of the present invention, it is preferable that the resin-layer through portion be made of polyimide resin.

In the implementation of the present invention, it is preferable that the substrate be chiefly made of a monocrystal intrinsic semiconductor material, and that the front surface have a crystal orientation of (100).

In the implementation of the present invention, it is preferable that the semiconductor element be a Hall element.

In the implementation of the present invention, it is preferable that the front-surface wiring line include an underlying layer and a plating layer that are mutually laminated, and that the plating layer be thicker than the underlying layer.

In the implementation of the present invention, it is preferable that the underlying layer include a Ti layer and a Cu layer that are mutually laminated, and that the plating layer be made of Cu.

In the implementation of the present invention, it is preferable that the substrate include a side surface that is in contact with the front surface and the mounting surface, and that the side surface be covered with the sealing resin.

In the implementation of the present invention, it is preferable that the semiconductor element include an element back surface that faces toward the substrate, and a plurality of electrode bumps formed on the element back surface. It is also preferable that the substrate be divided into regions by the sealing resin, and that each of the regions include a different one of a plurality of the front-surface wiring lines that are electrically connected to the respective electrode bumps.

In the implementation of the present invention, it is preferable that the front surface of the substrate be formed with a recess, and that the semiconductor element be arranged within the recess.

In the implementation of the present invention, it is preferable that the front surface of the substrate be formed with a plurality of recesses. It is also preferable that the semiconductor element include an element back surface that faces toward the substrate, and a plurality of electrode bumps formed on the element back surface, and that the semiconductor element be arranged such that the electrode bumps are positioned in the respective recesses.

In the implementation of the present invention, it is preferable that the recess penetrate to the mounting surface.

In the implementation of the present invention, it is preferable that the semiconductor element include an element front surface facing opposite from the substrate, and that the element front surface be exposed from the sealing resin.

In the implementation of the present invention, it is preferable that the semiconductor device further include: a column that stands from the front-surface wiring line and is electrically connected thereto; and an inductor that is arranged near a tip of the column and electrically connected thereto.

In the implementation of the present invention, it is preferable that the substrate include a base member and an insulation layer, the insulation layer covering surfaces of the base member that are seen from the opposite side of the mounting surface.

In the implementation of the present invention, it is preferable that the semiconductor device further include a divider that is located within the column, and that divides a portion of the column near the mounting surface into a plurality of portions.

In the implementation of the present invention, it is preferable that the divider be made of the same material as the substrate.

A third aspect of the present invention provides a method for manufacturing a semiconductor device. The method includes the steps of: forming a recess in a substrate material, the substrate material having a front surface and a back surface that face opposite from each other in a thickness direction, the recess being recessed from the front surface; forming a resin layer within the recess, the resin layer including a resin-layer through portion having an orthogonal surface orthogonal to the back surface; forming a wiring section including a column that fills a portion surrounded by the orthogonal surface; mounting a semiconductor element such that the semiconductor element is electrically connected to the wiring section; forming a sealing resin to cover the semiconductor element; and removing a portion of the substrate material around the back surface to expose a portion of the column from the substrate material.

In the implementation of the present invention, it is preferable that the step of forming the resin layer include the substeps of: applying a photosensitive resin material, which ultimately becomes the resin layer, to all surfaces of the substrate material at the front surface side; and removing the portion surrounded by the orthogonal surface by exposure and development.

In the implementation of the present invention, it is preferable that the step of forming the wiring section include the substeps of: forming an underlying layer on the substrate material at the front surface side by sputtering; forming a mask layer on the underlying layer by photolithography, the mask layer being for forming a plating layer; and forming the plating layer in contact with the underlying layer by electroplating.

In the implementation of the present invention, it is preferable that the method further include, after the step of exposing the portion of the column, the steps of: forming an insulation film by photolithography, the insulation film covering a mounting surface facing opposite from the front surface and having an opening surrounding an exposed surface of the column; and forming, in the opening, an electrode pad to be in contact with the exposed surface of the column by electroless plating.

A semiconductor device according to the present invention includes a column formed within a through-hole. The column serves as a conductive path between a semiconductor element mounted on a front surface and an electrode portion formed near a mounting surface. A resin-layer through portion is interposed between the column and an inner wall of the through-hole. The resin-layer through portion includes an orthogonal surface, which is in contact with the column and orthogonal to the mounting surface. Accordingly, the surface of the column that is in contact with the orthogonal surface of the resin layer is also orthogonal to the mounting surface. Accordingly, the cross sections of the column parallel to the mounting surface all have the same shape regardless of the inclination of the inner wall of the through-hole. In this way, even if the degree of grinding varies during a step of grinding the mounting surface of the substrate during the manufacturing process, the shape of the exposed surface of the column exposed by grinding does not change and variations in the area of the exposed surface do not occur.

Other features and advantages of the present invention will become apparent from the detailed description given below with reference to the accompanying drawings.

DRAWINGS

FIG. 40 is a plan view showing a semiconductor device according to a sixth embodiment of the present invention;

FIG. 41 is a cross-sectional view taken along line XLI-XLI of FIG. 40;

FIG. 52 is a cross-sectional view for describing a step of manufacturing the semiconductor device of FIG. 46;

FIG. 53 is a cross-sectional view for describing a step of manufacturing the semiconductor device of FIG. 46;

EMBODIMENTS

Figure 1:
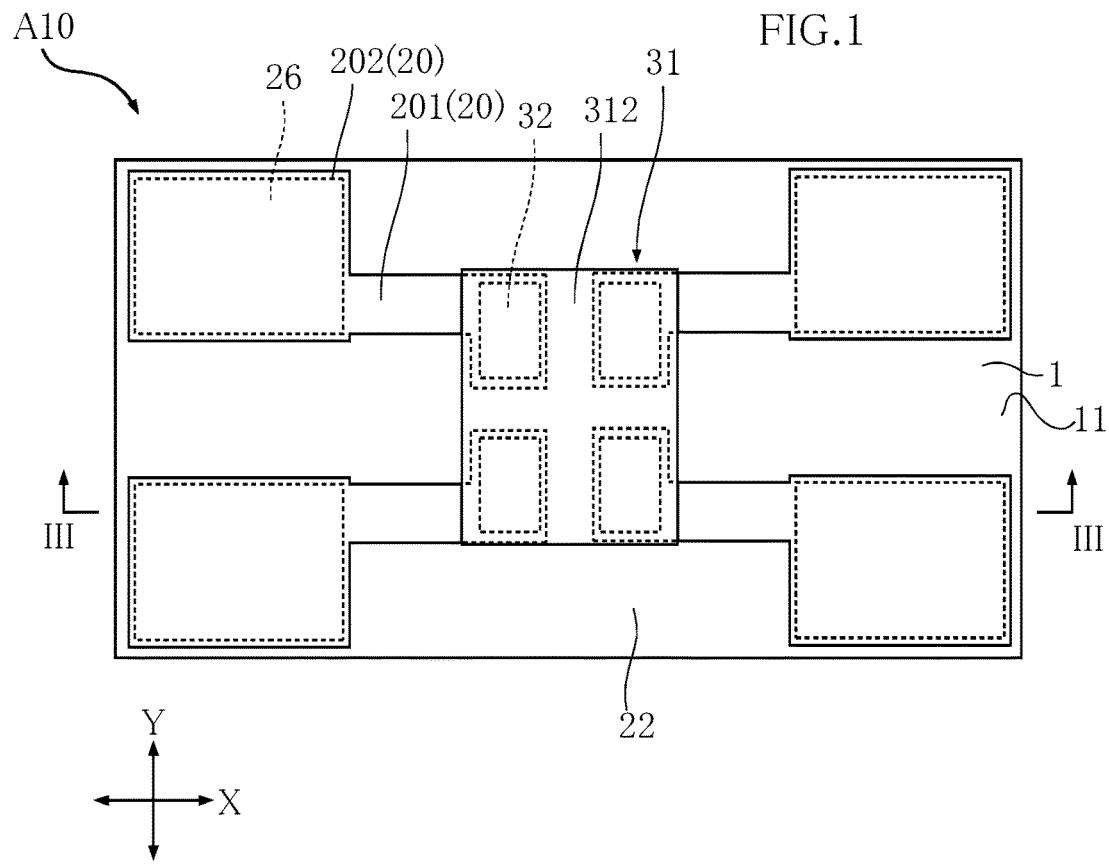
FIG. 1 is a plan view showing a semiconductor device according to a first embodiment of the present invention (a sealing resin is shown transparent)

The following describes embodiments for implementing the present invention with reference to the attached drawings.

First Embodiment

With reference to FIGS. 1 to 4, a semiconductor device A10 according to a first embodiment of the present invention is described. The semiconductor device A10 includes a substrate 1, a wiring section 20, a resin layer 22, an insulation film 24, an electrode pad 26, a semiconductor element 31, a bonding layer 32, and a sealing resin 4.

Figure 2:
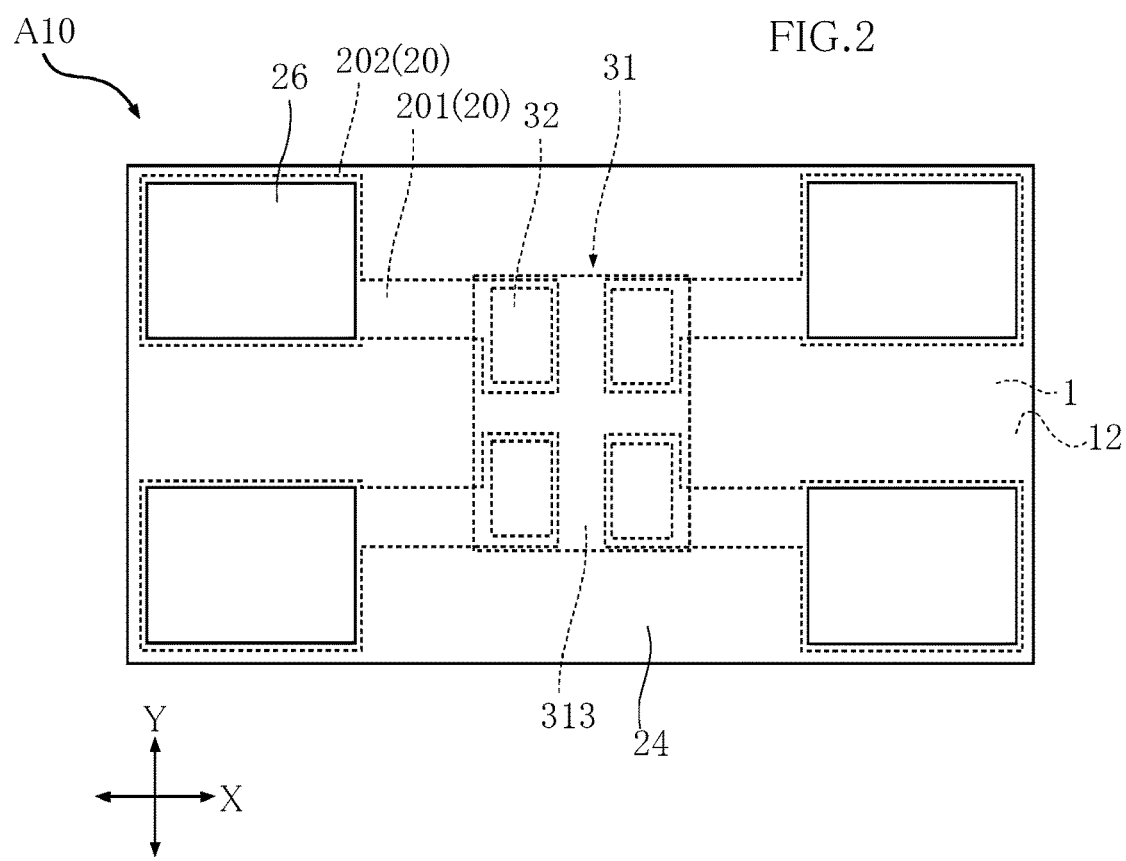
FIG. 2 is a bottom view showing the semiconductor device of FIG. 1.
Figure 3:
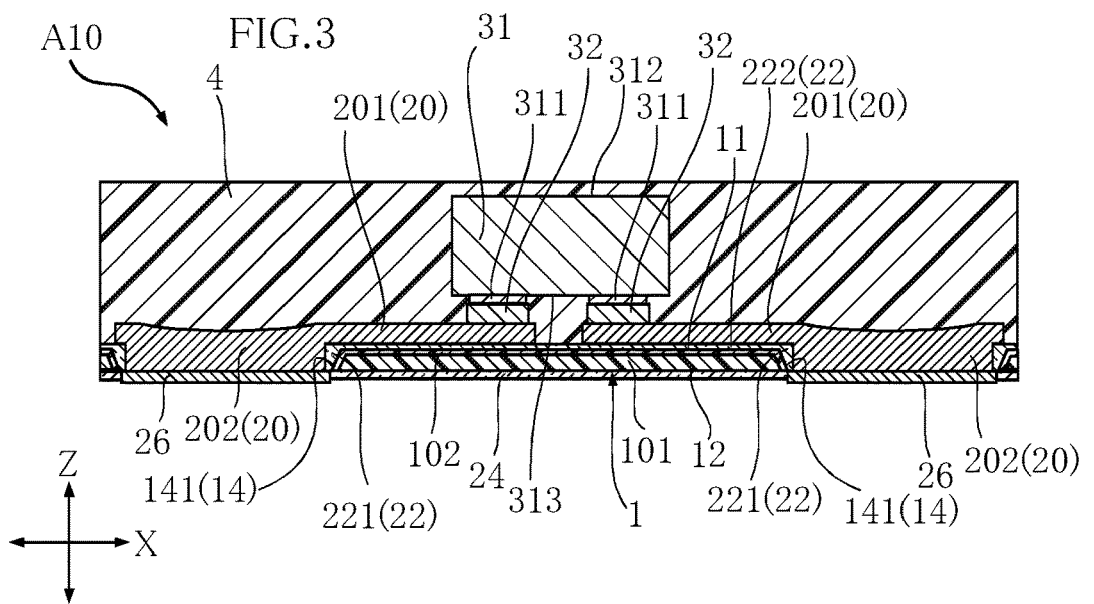
FIG. 3 is a cross-sectional view taken along line in FIG. 1.
Figure 4:
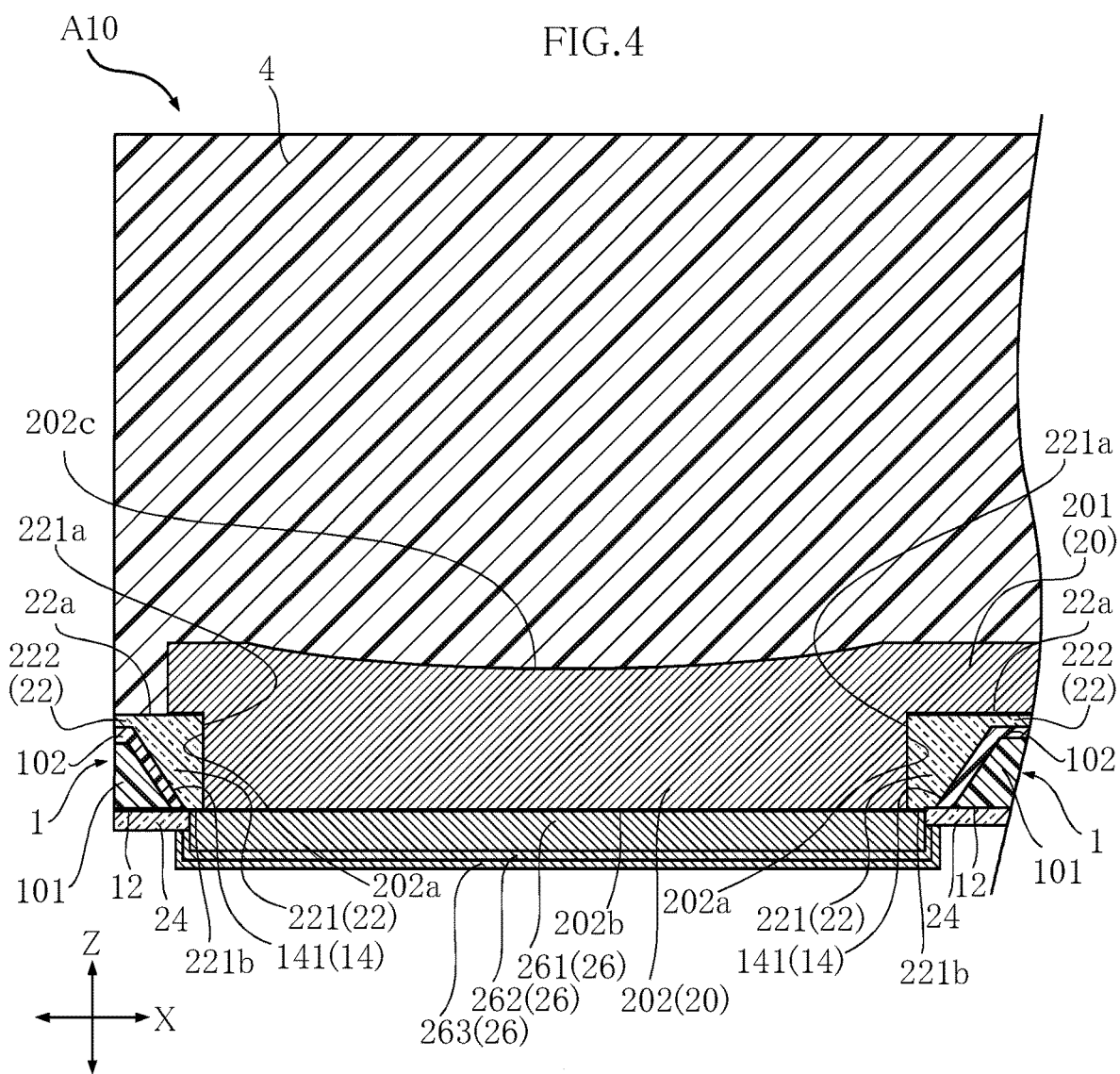
FIG. 4 is an enlarged cross-sectional view showing a main part of the semiconductor device of FIG. 1.

FIG. 1 is a plan view showing the semiconductor device A10, and the sealing resin 4 is shown transparent for ease of understanding. FIG. 2 is a bottom view showing the semiconductor device A10. FIG. 3 is a cross-sectional view taken along line III-III in FIG. 1. FIG. 4 is an enlarged cross-sectional view showing a main part of the semiconductor device A10.

The semiconductor device A10 shown in these figures is designed to be mounted on any of the surfaces of circuit boards in various devices. In the present embodiment, the semiconductor device A10 is a magnetic sensor having the semiconductor element 31 which is a Hall element. As shown in FIG. 1, the semiconductor device A10 is rectangular as viewed in the thickness direction Z of the substrate 1 (hereinafter "as viewed in plan"). For convenience of description, the long-side direction (horizontal direction in the plan view) of the semiconductor device A10, which is perpendicular to the thickness direction Z of the substrate 1, is defined as a first direction X. The short-side direction (vertical direction in the plan view) of the semiconductor device A10, which is perpendicular to both the thickness direction Z of the substrate 1 and the first direction X, is defined as a second direction Y. In the present embodiment, the semiconductor device A10 has a dimension of approximately 140 to 200 µm in the thickness direction Z, approximately 700 to 1200 µm in the first direction X, and approximately 350 to 600 µm in the second direction Y. Note that the dimensions are not limited to those described above.

As shown in FIGS. 1 to 4, the substrate 1 is a member on which the semiconductor element 31 is mounted, and is used to mount the semiconductor device A10 on a circuit board. As viewed in plan, the substrate 1 has a rectangular shape whose long-sides extend along the first direction X. The substrate 1 has a dimension of approximately 30 to 50 µm in the thickness direction Z. Note that the shape and dimensions of the substrate 1 are not limited to those described above. The substrate 1 has a front surface 11, a mounting surface 12, and a through-hole 14.

As shown in FIGS. 1 to 3, the front surface 11 and the mounting surface 12 face opposite from each other in the thickness direction Z of the substrate 1. The front surface 11 and the mounting surface 12 are flat surfaces orthogonal to the thickness direction Z of the substrate 1. The front surface 11 faces upward in FIG. 3. The front surface 11 is rectangular. The mounting surface 12 faces downward in FIG. 3. The mounting surface 12 is rectangular.

As shown in FIGS. 3 and 4, the through-hole 14 penetrates through the substrate 1 from the front surface 11 to the mounting surface 12 in the thickness direction Z. In the present embodiment, a total of four through-holes 14 are provided, each of which is in the vicinity of a different one of four corners of the substrate 1. In the present embodiment, the through-hole 14 is rectangular as viewed in plan. Inner walls 141 of the through-hole 14 are inclined to the thickness direction Z, and each form an angle of approximately 55° with respect to the mounting surface 12. Accordingly, the cross sections of the through-hole 14 parallel to the mounting surface 12 are smaller in dimensions toward the mounting surface 12. This means that the cross sections of the through-hole 14 parallel to the mounting surface 12 are also smaller in area toward the mounting surface 12. An opening of the through-hole 14 at the front surface 11 has dimensions that are each approximately 120 to 180 µm. Note that the through-hole 14 is not limited in terms of number, arrangement, shape, and dimensions.

The substrate 1 includes a base member 101 and an insulation layer 102. The base member 101 is chiefly made of a monocrystal intrinsic semiconductor material. In the present embodiment, the base member 101 is chiefly made of Si. The base member 101 may be made of other materials. In the present embodiment, a (100) surface of the base member 101, which has a crystal orientation of (100), is used as the front surface 11. The through-hole 14 is formed by performing anisotropic etching using KOH on the (100) surface of the base member 101. Accordingly, the inner walls 141 are inclined to the thickness direction Z.

The insulation layer 102 is formed on the base member 101, and covers the surfaces of the base member 101 that are seen from the opposite side of the mounting surface 12. In the present embodiment, the insulation layer 102 is made of $SiO_2$, and is formed by thermally oxidizing the base member 101. The insulation layer 102 electrically insulates the base member 101 from the wiring section 20. In the present embodiment, the insulation layer 102 has a thickness (dimension in the thickness direction Z) of approximately 0.7 to 1.0 μm, for example. The substrate 1 may not necessarily have the insulation layer 102 because the resin layer 22 functions as the insulation layer 102.

The resin layer 22 is interposed between the substrate 1 and the wiring section 20. The resin layer 22 is made of polyimide resin, for example. The resin layer 22 has an outer surface 22a, and includes a resin-layer front surface portion 222 and a resin-layer through portion 221.

The outer surface 22a is orthogonal to the thickness direction Z, and faces upward in FIG. 4. The outer surface 22a is flush with any other outer surfaces 22a across the entirety of the resin layer 22. The resin-layer front surface portion 222 of the resin layer 22 is a portion formed on the front surface 11, and has a uniform thickness. In the present embodiment, the resin-layer front surface portion 222 has a thickness (dimension in the thickness direction Z) of approximately 5 to 10 μm, for example.

The resin-layer through portion 221 of the resin layer 22 is formed within the through-hole 14. The resin-layer through portion 221 is interposed between the inner walls 141 of the through-hole 14 and a column 202 of the wiring section 20 described below. The resin-layer through portion 221 has orthogonal surfaces 221a and an exposed surface 221b. The exposed surface 221b is orthogonal to the thickness direction Z, and faces downward in FIG. 4. The exposed surface 221b is exposed from the mounting surface 12 of the substrate 1, and has a rectangular ring shape as viewed from the mounting surface 12 side. The exposed surface 221b is flush with the mounting surface 12.

The orthogonal surfaces 221a are flat surfaces orthogonal to the mounting surface 12 and located opposite from the inner walls 141 of the through-hole 14. The resin-layer through portion 221 formed within the through-hole 14 has four rectangular orthogonal surfaces 221a. The resin-layer through portion 221 is formed within the through-hole 14 having the inner walls 141 inclined to the thickness direction Z, and thereby forms a through-hole having the orthogonal surfaces 221a parallel to the thickness direction Z. Note that the resin layer 22 is not limited to polyimide resin. As described below in a manufacturing method, the resin layer 22 is formed by photolithography. Accordingly, the resin layer 22 needs to be a photosensitive resin, such as epoxy resin or a solder resist.

As shown in FIGS. 1 to 4, the wiring section 20 is a conductor formed on the substrate 1 and electrically connected to the semiconductor element 31. The wiring section 20 includes an underlying layer and a plating layer that are mutually laminated. The underlying layer is formed on the substrate 1, and is electrically insulated from the base member 101 by the insulation layer 102 and the resin layer 22. The underlying layer is made up of a Ti layer and a Cu layer that are mutually laminated, and has a thickness of approximately 200 to 800 nm. The plating layer is formed to be in contact with an outer surface of the underlying layer (the surface facing opposite from the substrate 1). The plating layer is made of Cu, and has a thickness of approximately 3 to 10 μm. The thickness of the plating layer is designed to be larger than the thickness of the underlying layer. Since the underlying layer and the plating layer are integrated, they are shown as the wiring section 20 with no distinction therebetween in FIGS. 3 and 4. The wiring section 20 is not limited in terms of material and thickness. According to the present embodiment, the wiring section 20 includes a front-surface wiring line 201 and the column 202.

As shown in FIGS. 1 to 4, the front-surface wiring line 201 is a portion of the wiring section 20 formed on the front surface 11 of the substrate 1. The semiconductor element 31 is connected to the front-surface wiring line 201. As shown in FIGS. 3 and 4, the column 202 is a conductor that passes through the substrate 1. The column 202 is formed to fill the portion surrounded by the orthogonal surfaces 221a of the resin-layer through portion 221 within the through-hole 14. The column 202 is exposed from the front surface 11 and the mounting surface 12 of the substrate 1. One end of the column 202 exposed from the front surface 11 is connected to the front-surface wiring line 201. The other end of the column 202 exposed from the mounting surface 12 is connected to the electrode pad 26. In the present embodiment, the column 202 has a prismatic shape, and has side surfaces 202a and an exposed surface 202b. The exposed surface 202b is a surface at the other end of the column 202 exposed from the mounting surface 12, and is flush with the mounting surface 12. The side surfaces 202a are connected to the exposed surface 202b. The side surfaces 202a are flat surfaces that are in contact with the orthogonal surfaces 221a of the resin-layer through portion 221, and are orthogonal to the mounting surface 12. The column 202 is not limited in terms of shape, and may be cylindrical, for example. In the present embodiment, the front-surface wiring line 201 and the column 202 are formed integrally with the same material. Alternatively, the front-surface wiring line 201 and the column 202 may be formed separately with different materials.

As shown in FIGS. 3 and 4, the electrode pad 26 is a conductor that is in contact with the exposed surface 202b of the column 202. As shown in FIG. 4, the electrode pad 26 includes a Ni layer 261, a Pd layer 262, and a Au layer 263 that are mutually laminated. In the present embodiment, the electrode pad 26 covers the exposed surface 202b of the column 202 exposed from the mounting surface 12. In the present embodiment, the electrode pad 26 has a rectangular shape. In the present embodiment, the electrode pad 26 has a thickness (dimension in the thickness direction Z) of approximately 3 to 15 μm, for example. The electrode pad 26 is not limited in terms of thickness, material, and shape. The electrode pad 26 is used to mount the semiconductor device A10 on a surface of the circuit board of an electronic device (not shown), for example. The electrode pad 26 corresponds to the "electrode portion" in the present disclosure. Note that a solder ball may be formed on the electrode pad 26. Alternatively, it is possible to omit the electrode pad 26 and form a solder ball directly in contact with the exposed surface 202b of the column 202. In this case, the solder ball corresponds to the "electrode portion" of the present disclosure.

The wiring section 20 and the electrode pad 26 constitute a conductive path between the semiconductor element 31 and the circuit board on which the semiconductor device A10 is mounted. Note that the arrangement of the wiring section 20 and the electrode pad 26 shown in FIGS. 1 to 4 is merely an example, and the actual arrangement of the wiring section 20 and the electrode pad 26 in the semiconductor device A10 is not limited to this.

The insulation film 24 is formed on the mounting surface 12 of the substrate 1, and electrically insulates the electrode pad 26 from an adjacent electrode pad 26. The insulation film 24 covers the entire mounting surface 12, as well as all other surfaces facing the same direction as the mounting surface 12 in the semiconductor device A10, except for the area in which the electrode pad 26 is formed. The insulation film 24 only needs to cover the entire mounting surface 12, but may cover a portion of the exposed surface 202b of the column 202 exposed from the mounting surface 12. The insulation film 24 also serves to prevent the material of the electrode pad 26 from being deposited on the mounting surface 12 when the electrode pad 26 is formed by electroless plating in the manufacturing process described below. The insulation film 24 is formed by photolithography, for example, with an insulation material such as polyimide resin. In the present embodiment, the insulation film 24 has a thickness (dimension in the thickness direction Z) of approximately 3 to 10 μm, for example. Note that the insulation film 24 is not limited in terms of thickness, material, and forming methods.

As shown in FIGS. 1 to 3, the semiconductor element 31 is connected to the front-surface wiring line 201 via the bonding layer 32, and is thereby mounted on the front surface 11 of the substrate 1. The semiconductor element 31 has a rectangular plate shape as viewed in plan, and has an element front surface 312 and an element back surface 313. As shown in FIG. 3, the element front surface 312 and the element back surface 313 face opposite from each other in the thickness direction Z. The element front surface 312 faces upward in FIG. 3. The element back surface 313 faces downward in FIG. 3, and is used when the semiconductor element 31 is mounted on the substrate 1. The element back surface 313 is provided with an electrode bump 311. The electrode bump 311 is made of an alloy solder containing Sn, or is made of Ni/Pd/Au, for example. The electrode bump 311 is in contact with the bonding layer 32 that is in contact with the front-surface wiring line 201. That is, the semiconductor element 31 according to the present embodiment is a so-called flip-chip element. The semiconductor element 31 has a thickness (dimension in the thickness direction Z) of approximately 60 to 80 μm, for example. According to the present embodiment, the semiconductor element 31 may be a Hall element. However, the semiconductor element 31 is not limited to this, and may be a semiconductor element other than a Hall element.

As shown in FIG. 3, the bonding layer 32 is a conductor interposed between the electrode bump 311 of the semiconductor element 31 and the front-surface wiring line 201. The bonding layer 32 allows the semiconductor element 31 to be fixedly connected to the front-surface wiring line 201, and ensures the conductivity between the semiconductor element 31 and the front-surface wiring line 201. According to the present embodiment, the bonding layer 32 is made up of a Ni layer and an alloy layer containing Sn that are mutually laminated. The alloy layer is made of lead-free solder such as a Sn—Ag alloy or a Sn—Sb alloy. Note that the bonding layer 32 is not limited in terms of material.

As shown in FIG. 3, the sealing resin 4 is a member formed on the front surface 11 of the substrate 1 to cover the semiconductor element 3l. According to the present embodiment, the sealing resin 4 also covers the wiring section 20 in addition to the semiconductor element 31. The sealing resin 4 has an electrical insulation property, and may be a synthetic resin that contains black epoxy resin as a main component. In the present embodiment, the sealing resin 4 covers the semiconductor element 31, the wiring section 20, and the front surface 11 of the substrate 1 without exposing them. In the present embodiment, the sealing resin 4 overlaps with the substrate 1 as viewed in plan, and is therefore rectangular in plan view. Note that the sealing resin 4 is not limited in terms of material and shape.

Next, an example of a method for manufacturing the semiconductor device A10 will be described with reference to FIGS. 5 to 21. Each of these figures shows a cross section in the yz plane along line in FIG. 1. Note that the thickness direction Z, first direction X, and second direction Y of a substrate material 100 shown in these figures and described below are the same as the directions indicated by the thickness direction Z, first direction X, and second direction Y of the substrate 1 shown in FIGS. 1 to 4.

First, a substrate material 100 is prepared. The substrate material 100 is made of a monocrystal of a semiconductor material. In the present embodiment, the substrate material 100 is a Si monocrystal. The substrate material 100 has a thickness of approximately 700 to 800 μm, for example. The substrate material 100 is sufficient for the preparation of a plurality of the substrates 1 for a plurality of the semiconductor devices A10 described above. In other words, the manufacturing steps described below are performed to collectively manufacture the plurality of semiconductor devices A10. The substrate material 100 has a front surface 110 and a back surface 120 that face opposite from each other in the thickness direction Z. In the present embodiment, the front surface 110 is a (100) surface having a crystal orientation of (100). The front surface 110 will ultimately become a front surface 11.

Figure 5:
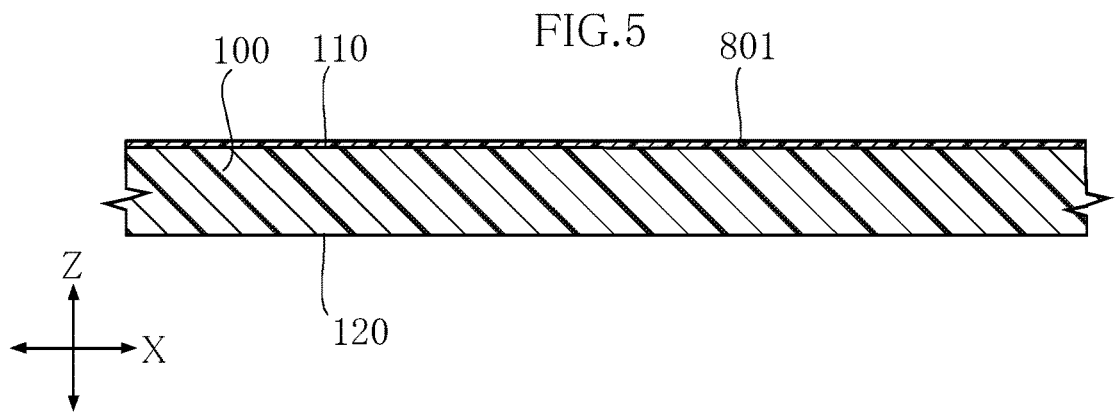
FIG. 5 is a cross-sectional view for describing a step of manufacturing the semiconductor device of FIG. 1.

Next, as shown in FIG. 5, the front surface 110 is thermally oxidized, for example, to form a mask layer 801 made of $SiO_2$. The mask layer 801 has a thickness of approximately 0.7 to 1.0 μm, for example.

Figure 6:
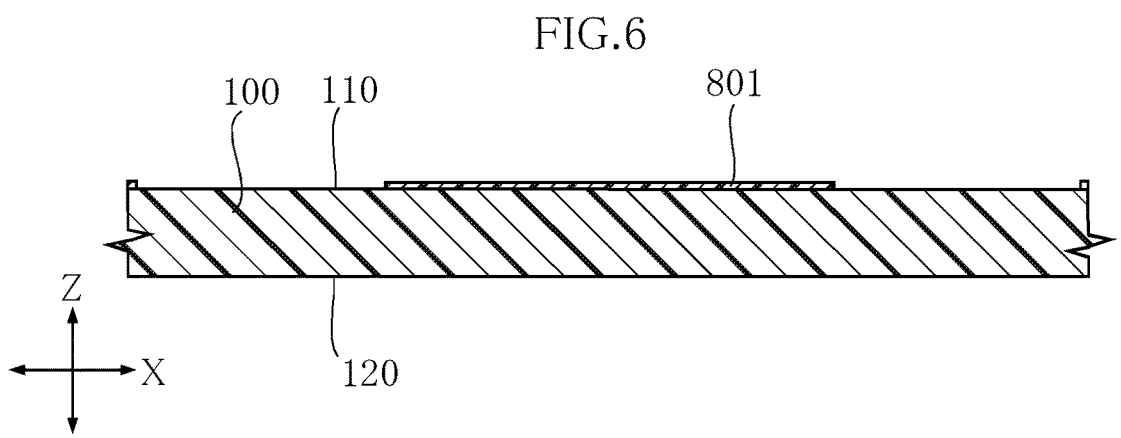
FIG. 6 is a cross-sectional view for describing a step of manufacturing the semiconductor device of FIG. 1.

Next, as shown in FIG. 6, the mask layer 801 is patterned by etching. Specifically, the mask layer 801 is covered with a resist formed by photolithography, and is then etched. Thereafter, the resist is peeled off. As a result, the mask layer 801 is formed with an opening. The shape and size of the opening are selected according to the shape and size of a through-hole 14 that is to be ultimately produced. In the present embodiment, the opening is rectangular.

Figure 7:
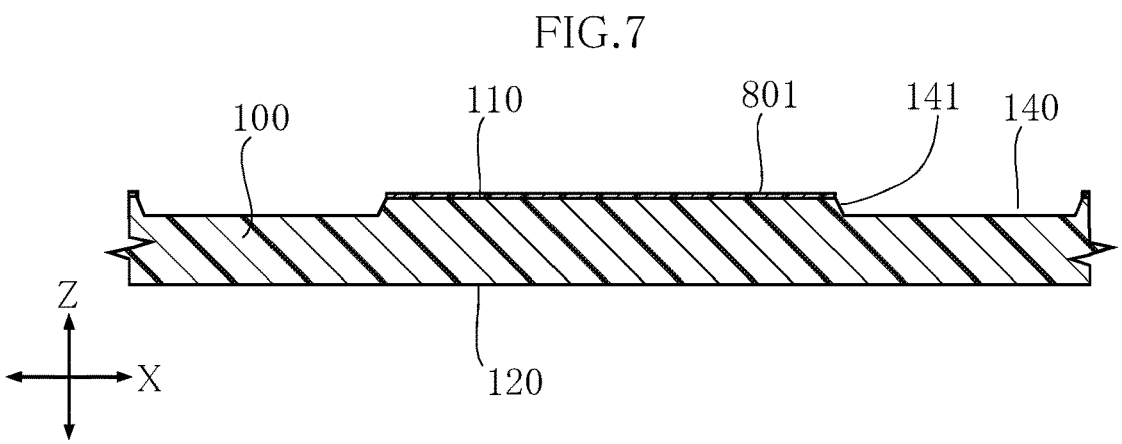
FIG. 7 is a cross-sectional view for describing a step of manufacturing the semiconductor device of FIG. 1.

Next, as shown in FIG. 7, a recess 140 is formed. The recess 140 is formed by anisotropic etching using KOH, for example. KOH is an example of an alkaline etching solution suitable for the anisotropic etching of a Si monocrystal. Through the anisotropic etching, the recess 140 having inner walls 141 is formed. The recess 140 will ultimately become the through-hole 14. The inner walls 141 form an angle of approximately 55° with the back surface 120 (xy plane). In the present embodiment, the recess 140 has a depth (dimension in the thickness direction Z) of approximately 50 to 80 μm. Note that the etching solution is not limited to KOH, and may be an alkaline solution such as TMAH (tetramethyl ammonium hydroxide) or EDP (ethylene diamine pyrocatechol). Alternatively, isotropic etching may be performed using a solution of fluonitric acid (a mixed acid of HF and HNO$_3$) as an etching solution. Next, the mask layer 801 is removed. The mask layer 801 is removed by etching using HF, for example.

Figure 8:
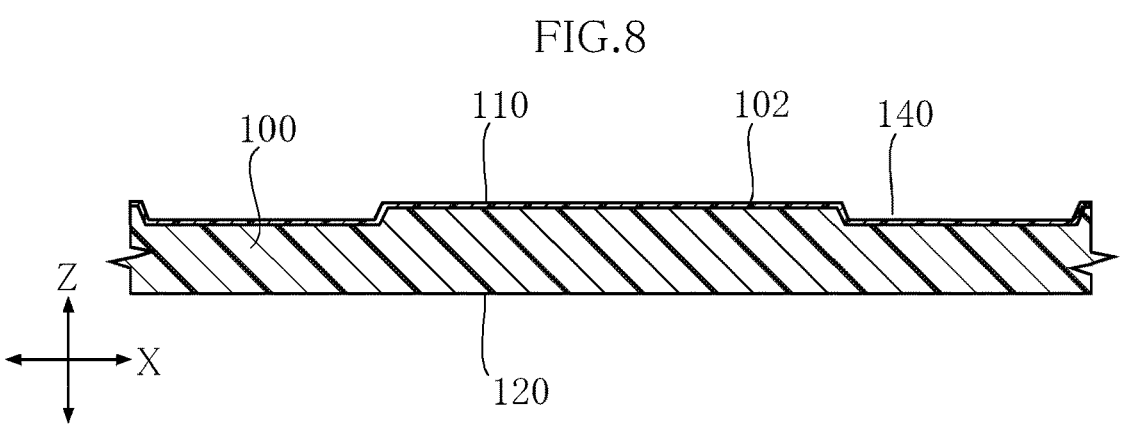
FIG. 8 is a cross-sectional view for describing a step of manufacturing the semiconductor device of FIG. 1.

Next, as shown in FIG. 8, an insulation layer 102 made of SiO$_2$, for example, is formed. The insulation layer 102 is formed by thermally oxidizing all surfaces (the front surface 110 and the inner surfaces of the recess 140) of the substrate material 100 located opposite from the back surface 120. The insulation layer 102 formed by this step has a thickness of approximately 0.7 to 1.0 μm, for example.

Figure 9:
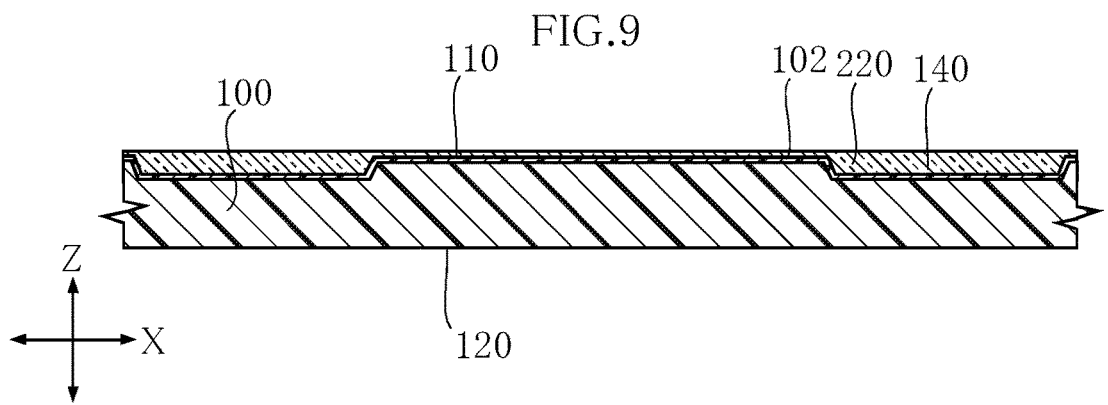
FIG. 9 is a cross-sectional view for describing a step of manufacturing the semiconductor device of FIG. 1.
Figure 10:
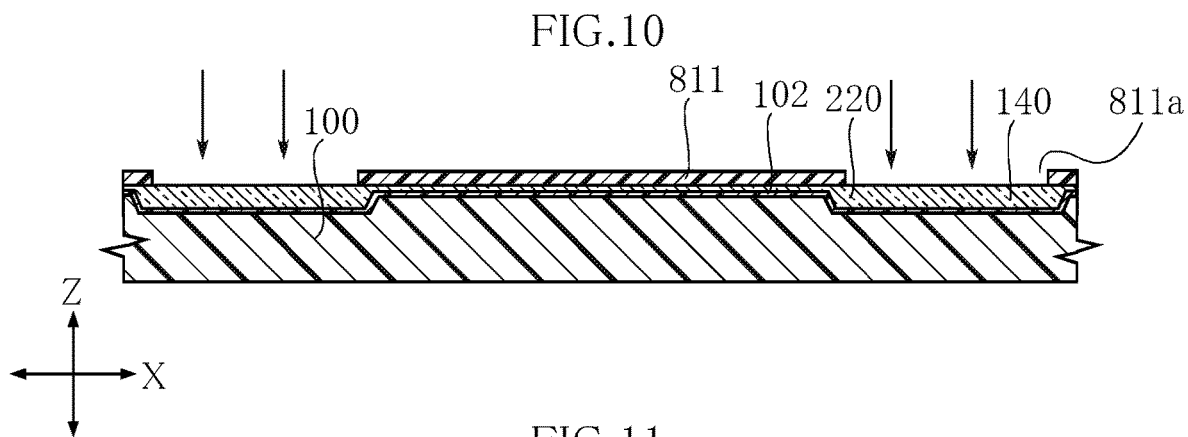
FIG. 10 is a cross-sectional view for describing a step of manufacturing the semiconductor device of FIG. 1.
Figure 11:
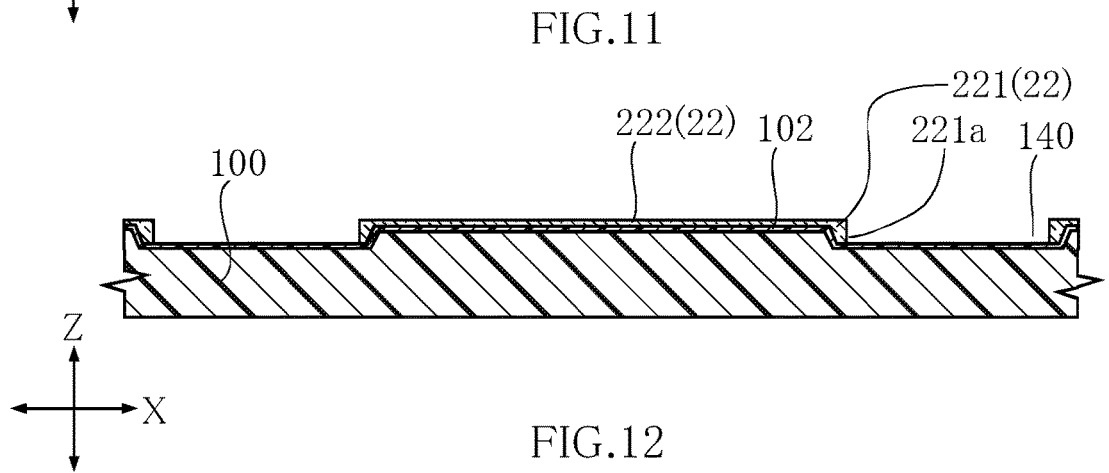
FIG. 11 is a cross-sectional view for describing a step of manufacturing the semiconductor device of FIG. 1.

Next, as shown in FIGS. 9 to 11, a resin layer 22 is formed by photolithography.

First, as shown in FIG. 9, a resin layer 220 is formed on all surfaces of the substrate material 100 on the front surface 110 side. The resin layer 220 is formed by applying a photosensitive polyimide resin to the substrate material 100 using, for example, a spin coater (rotary coating apparatus). The resin layer 220 is formed to fill the inside of the recess 140. Note that the resin layer 220 may be formed by laminating a photosensitive polyimide resin film.

Next, as shown in FIG. 10, the resin layer 220 is exposed to light. The resin layer 220 is selectively exposed with a predetermined pattern via a photomask 811. The photomask 811 is provided with a rectangular light-transmissive portion 811*a*. This light-transmissive portion 811*a* is smaller than the recess 140 and positioned within the recess 140 as viewed in plan.

Next, as shown in FIG. 11, the resin layer 22 is formed by carrying out development. Since the resin layer 220 is of a positive type, the exposed portion is removed by a developing solution. The portion of the resin layer 220 overlapping with the light-transmissive portion 811*a* of the photomask 811 in plan view is exposed and thus removed by the development, exposing the insulation layer 102. On the other hand, the portion of the resin layer 220 not overlapping with the light-transmissive portion 811*a* in plan view is not exposed and thus remains as the resin layer 22. As a result, a resin-layer through portion 221, which has orthogonal surfaces 221*a* orthogonal to the back surface 120 (xy plane), is formed within the recess 140. Through the above step, the resin layer 22 is formed.

Next, a wiring section 20 and a bonding layer 32 are formed as shown in FIGS. 12 to 16.

Figure 12:
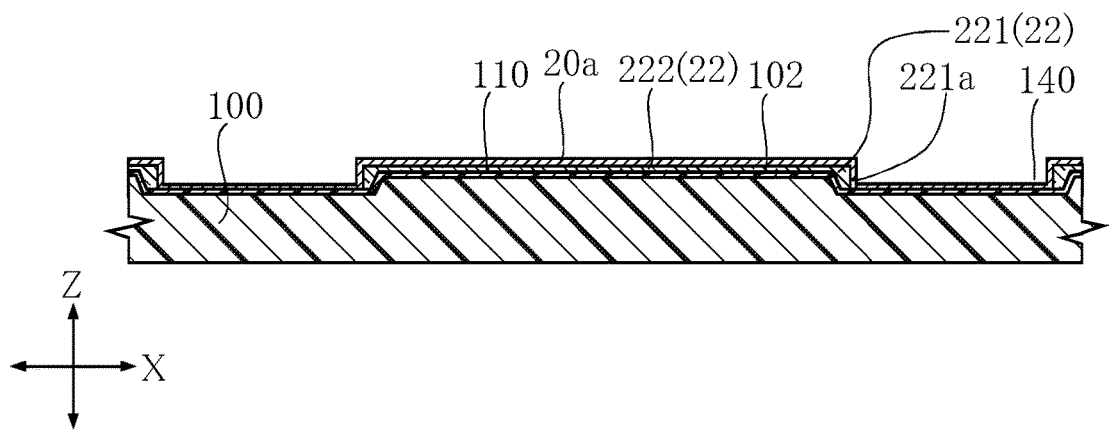
FIG. 12 is a cross-sectional view for describing a step of manufacturing the semiconductor device of FIG. 1.

First, as shown in FIG. 12, an underlying layer 20*a* is formed on the substrate material 100 at the front surface 110 side. The underlying layer 20*a* covers the resin layer 22, as well as the insulation layer 102 exposed at the bottom surface of the recess 140. The underlying layer 20*a* is formed by sputtering. According to the present embodiment, the underlying layer 20*a* is made up of a Ti layer and a Cu layer that are mutually laminated, and has a thickness of approximately 200 to 800 nm. In the forming of the underlying layer 20*a*, the Ti layer is formed to be in contact with the resin layer 22 and the insulation layer 102, and then the Cu layer is formed to be in contact with the Ti layer.

Figure 13:
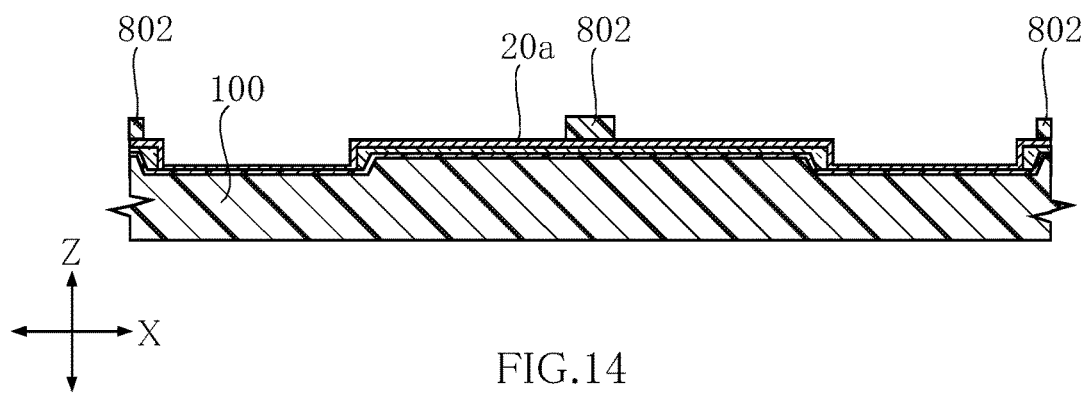
FIG. 13 is a cross-sectional view for describing a step of manufacturing the semiconductor device of FIG. 1.

Next, as shown in FIG. 13, a mask layer 802 for forming a plating layer 20*b* is formed on the underlying layer 20*a* by photolithography. After the mask layer 802 is formed over the substrate material 100 such that the mask layer 802 covers the entire surface of the underlying layer 20*a*, the mask layer 802 is patterned by exposure and development. The mask layer 802 is formed by applying a photosensitive resist to the substrate material 100 using, for example, a spin coater (rotary coating apparatus). Since the mask layer 802 according to the present embodiment is of a positive type, the exposed portion is removed by a developing solution. The underlying layer 20*a* is exposed from the portion of the mask layer 802 removed by exposure. The portion at which the mask layer 802 is removed corresponds to a portion at which a wiring section 20 is to be ultimately formed.

Figure 14:
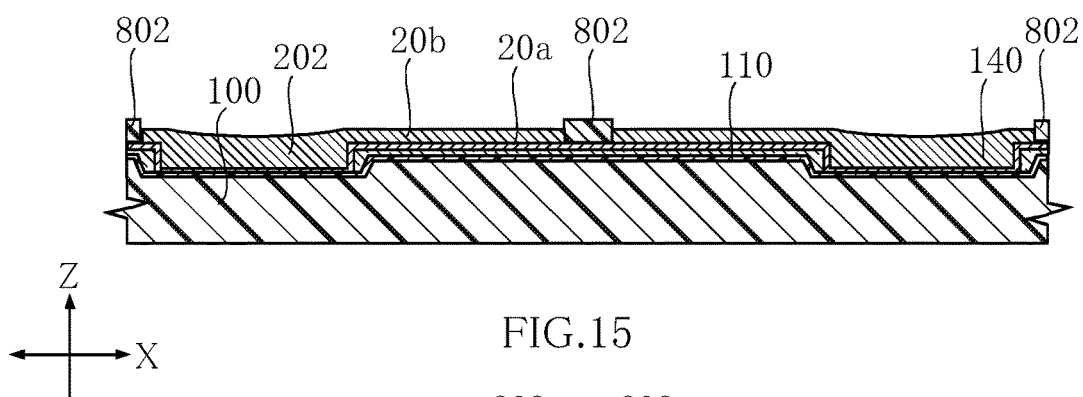
FIG. 14 is a cross-sectional view for describing a step of manufacturing the semiconductor device of FIG. 1.

Next, as shown in FIG. 14, the plating layer 20*b* is formed to be in contact with the underlying layer 20*a* exposed from the mask layer 802. The plating layer 20*b* is made of Cu, and is formed by electroplating using the underlying layer 20*a* as a conductive path. At this step, plating is deposited and grown more preferentially in a portion of the underlying layer 20*a* located at the recess 140 than a portion of the underlying layer 20*a* located at the front surface 110. This is because the plating solution is added with an inhibitor and an accelerator. As a result, the plating layer 20*b* is formed thinner in the portion located at the front surface 110 and thicker in the portion located at the recess 140. In the present embodiment, the plating layer 20*b* has a thickness of approximately 3 to 10 μm at the portion located at the front surface 110. The portion of the plating layer 20*b* located at the recess 140 and formed thicker serves as a main portion of a column 202. Thereafter, the mask layer 802 is removed.

Figure 15:
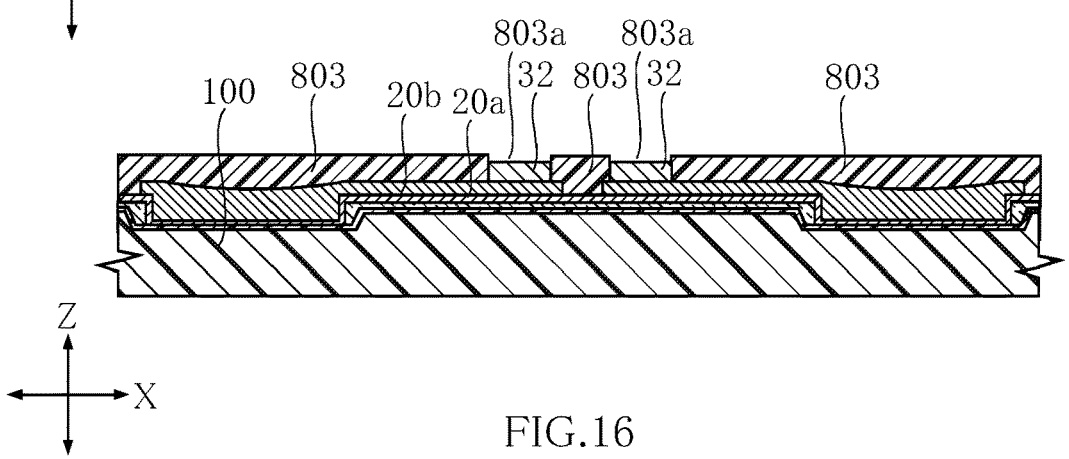
FIG. 15 is a cross-sectional view for describing a step of manufacturing the semiconductor device of FIG. 1.

Next, a bonding layer 32 is formed as shown in FIG. 15. First, a mask layer 803 for forming the bonding layer 32 is formed on the underlying layer 20*a* and the plating layer 20*b* by photolithography. After the mask layer 803 is formed over the substrate material 100 such that the mask layer 803 covers the underlying layer 20*a* and the plating layer 20*b*, the mask layer 803 is patterned by exposure and development. The composition and forming method of the mask layer 803 are the same as those of the mask layer 802. During this step, an opening 803*a* is formed in the mask layer 803 by exposure. According to the present embodiment, the opening 803*a* is formed at the plating layer 20*b*. The opening 803*a* has a rectangular parallelepiped shape (not shown) according to the present embodiment. Next, the bonding layer 32 is formed to be in contact with the plating layer 20*b*. The bonding layer 32 is formed to be in contact with the portion of the plating layer 20*b* located at the opening 803*a* of the mask layer 803. The bonding layer 32 is formed to fill the opening 803*a* of the mask layer 803 by electroplating using the underlying layer 20*a* and the plating layer 20*b* as a conductive path. The bonding layer 32 is made up of a Ni layer and an alloy layer containing Sn that are mutually laminated. The alloy layer is made of lead-free solder such as a Sn—Ag alloy or a Sn—Sb alloy. Thereafter, the mask layer 803 is removed.

Figure 16:
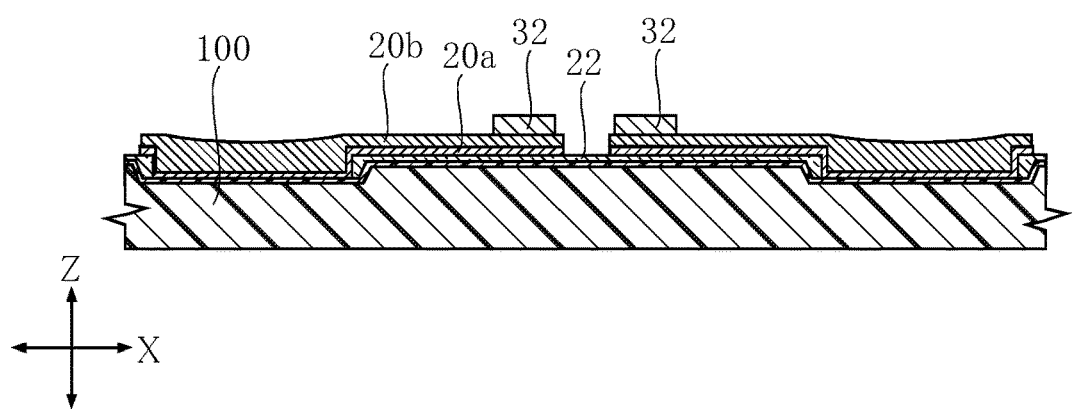
FIG. 16 is a cross-sectional view for describing a step of manufacturing the semiconductor device of FIG. 1.

Next, as shown in FIG. 16, all unnecessary portions of the underlying layer 20*a* not covered with the plating layer 20*b* are removed from the substrate material 100. Unnecessary portions of the underlying layer 20*a* are removed by wet etching, for example. This wet etching uses a mixed solution of H$_2$SO$_4$ (sulfuric acid) or H$_2$O$_2$ (hydrogen peroxide), for example. The resin layer 22 is exposed from the removed portions of the underlying layer 20*a*. Since the underlying layer 20*a* and the plating layer 20*b* that are mutually laminated are integrated, they are hereinafter shown as the wiring section 20 with no distinction therebetween. Through the above step, the wiring portion 20 and the bonding layer 32 are formed.

Figure 17:
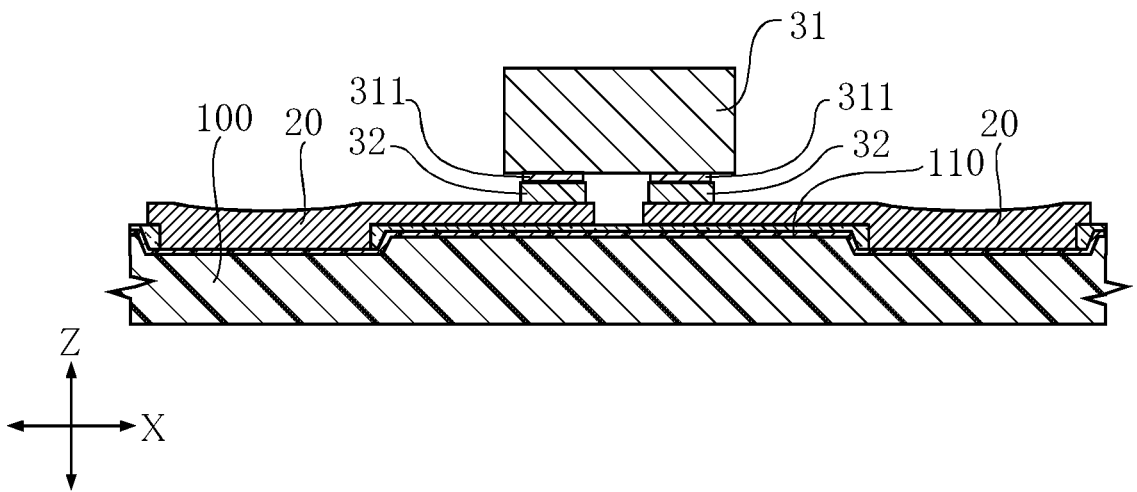
FIG. 17 is a cross-sectional view for describing a step of manufacturing the semiconductor device of FIG. 1.

Next, as shown in FIG. 17, a semiconductor element 31 is mounted on the front surface 110. The semiconductor element 31 is mounted by FCB (Flip Chip Bonding). After flux is applied to an electrode bump 311 of the semiconductor element 31, a flip-chip bonder is used to temporarily attach the semiconductor element 31 to the bonding layer 32 that is in contact with the wiring section 20 on the front surface 110. At this time, the bonding layer 32 is sandwiched between the wiring section 20 and the semiconductor element 31. Next, the bonding layer 32 is melted by reflowing and then solidified by cooling, whereby the mounting of the semiconductor element 31 is completed.

Figure 18:
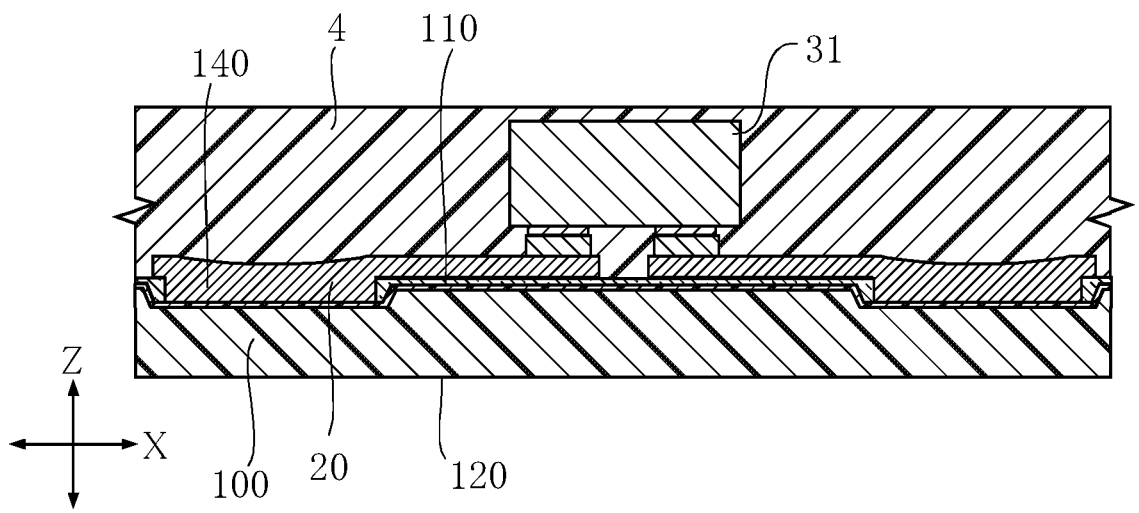
FIG. 18 is a cross-sectional view for describing a step of manufacturing the semiconductor device of FIG. 1.

Next, as shown in FIG. 18, a sealing resin 4 is formed to cover the semiconductor element 31. In the present embodiment, the wiring section 20 is also covered with the sealing resin 4. According to the present embodiment, the sealing resin 4 is a synthetic resin having an electrical insulation property. For example, the sealing resin 4 is a synthetic resin that contains black epoxy resin as a main component. The sealing resin 4 is formed to cover the semiconductor element 31, the wiring section 20, and the front surface 11 of the substrate 1 without exposing them.

Figure 19:
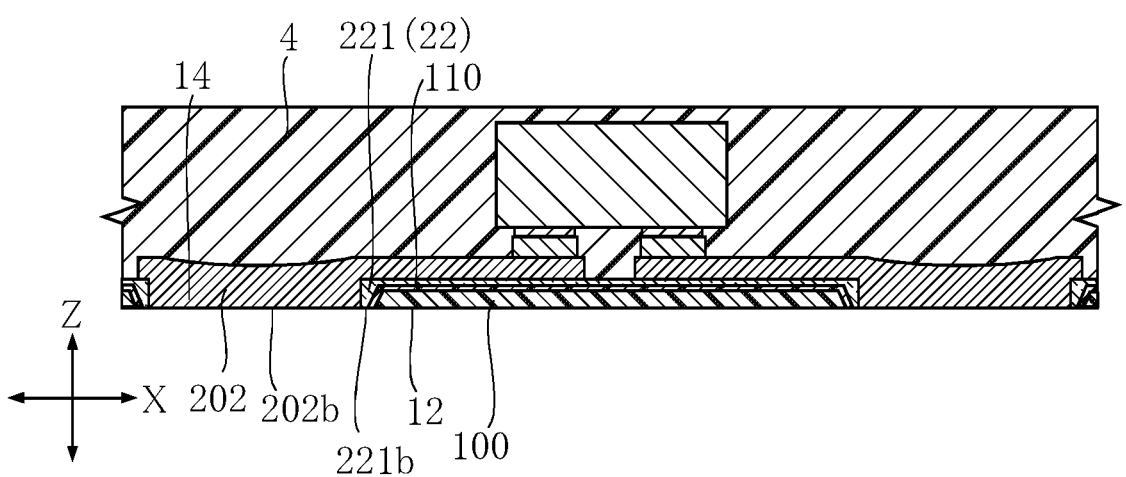
FIG. 19 is a cross-sectional view for describing a step of manufacturing the semiconductor device of FIG. 1.

Next, as shown in FIG. 19, the substrate material 100 is ground from the back surface 120 by mechanical grinding, for example. After the grinding, the surface opposite from the front surface 110 of the substrate material 100 serves as a mounting surface 12. In the present embodiment, the grinding is carried out until the overall dimension in the thickness direction Z (dimension from the mounting surface 12 to the top surface of the sealing resin 4) becomes a desired dimension (e.g., approximately 130 to 190 μm). In the present embodiment, the grinding is carried out until the substrate material 100 having a thickness of approximately 700 to 800 μm is ground to a thickness of approximately 30 to 50 μm. As a result of grinding, the column 202 has an exposed surface 202b exposed from the mounting surface 12 of the substrate material 100. The bottom surface of the recess 140 is ground and removed so that the recess 140 becomes the through-hole 14. In the present embodiment, the recess 140 having a depth of approximately 50 to 80 μm is ground to become the through-hole 14 having the same thickness as the substrate material 100 (approximately 30 to 50 μm). This means that the column 202 is also ground by approximately 20 to 30 μm. The exposed surface 202b becomes flush with the mounting surface 12. The resin-layer through portion 221 arranged between the through-hole 14 and the column 202 is partially ground to have an exposed surface 221b exposed in the shape of a rectangular ring. The exposed surface 221b is also flush with the exposed surface 202b of the column 202 and the mounting surface 12. The distance between the through-hole 14 and the column 202 at the exposed surface 221b (the width of the exposed surface 221b having the rectangular ring shape) varies depending on the degree of grinding. In the present embodiment, the distance is approximately 5 μm. Note that a portion of the substrate material 100 around the back surface 120 may be removed by a method other than the mechanical grinding.

Figure 20:
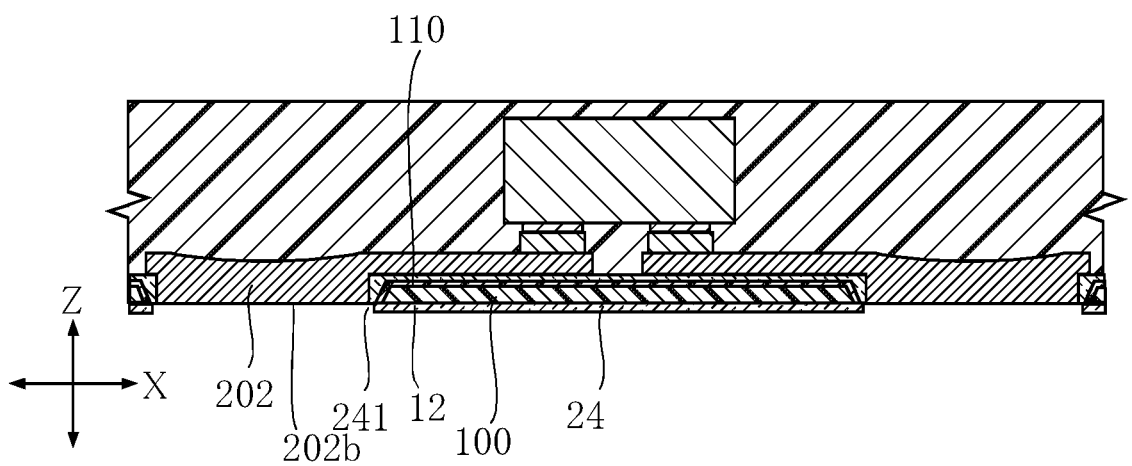
FIG. 20 is a cross-sectional view for describing a step of manufacturing the semiconductor device of FIG. 1.

Next, as shown in FIG. 20, an insulation film 24 is formed to cover the mounting surface 12 of the substrate material 100. According to the present embodiment, the insulation film 24 is formed by photolithography. First, the insulation film 24 is formed to cover all of the mounting surface 12 of the substrate material 100, the exposed surface 221b of the resin-layer through portion 221, and the exposed surface 202b of the column 202. The insulation film 24 is formed by applying a photosensitive polyimide resin using, for example, a spin coater (rotary coating apparatus). Next, the insulation film 24 is patterned by exposure and development. As a result of the exposure and development, the insulation film 24 is formed with an opening 241 surrounding the exposed surface 202b of the column 202.

Figure 21:
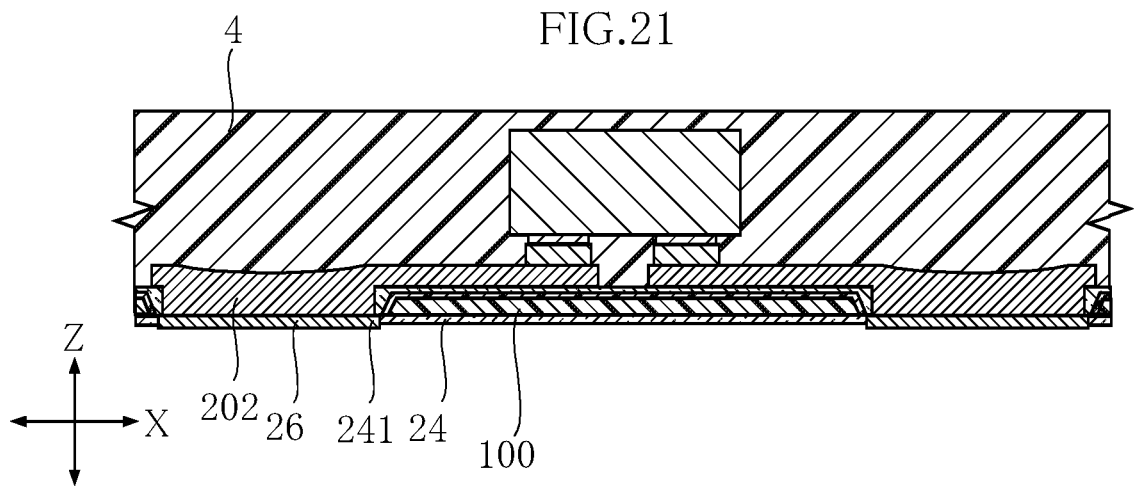
FIG. 21 is a cross-sectional view for describing a step of manufacturing the semiconductor device of FIG. 1.

Next, as shown in FIG. 21, an electrode pad 26 is formed in the opening 241 of the insulation film 24 such that the electrode pad 26 is in contact with the exposed surface 202b of the column 202. According to the present embodiment, the electrode pad 26 includes a Ni layer, a Pd layer, and a Au layer that are mutually laminated. The electrode pad 26 is formed by causing the Ni layer, the Pd layer, and the Au layer to be deposited in this order by electroless plating.

Next, the substrate material 100 and the sealing resin 4 are cut along the first direction X and also cut along the second direction Y. In this way, the substrate material 100 and the sealing resin 4 are divided into individual pieces that each correspond to the substrate 1 of the semiconductor device A10. The substrate material 100 and the sealing resin 4 are cut along cut lines by, for example, plasma dicing. The individual pieces obtained by the dividing step serve as the semiconductor devices A10. The semiconductor devices A10 are manufactured through the above steps.

Next, the advantages of the semiconductor device A10 and the method for manufacturing the same will be described.

In the semiconductor device A10, the column 202 is formed within the through-hole 14 of the substrate 1. The resin-layer through portion 221 is formed between the inner walls 141 of the through-hole 14 and the side surfaces 202a of the column 202. Since the orthogonal surfaces 221a of the resin-layer through portion 221 are flat surfaces orthogonal to the mounting surface 12, the side surfaces 202a of the column 202 that are in contact with the orthogonal surface 221a are also flat surfaces orthogonal to the mounting surface 12. Accordingly, the cross sections of the column 202 parallel to the mounting surface 12 all have the same shape regardless of the inclination of the inner walls 141 of the through-hole 14. Accordingly, even if the degree of grinding varies during the grinding step of the manufacturing process, the shape of the exposed surface 202b of the column 202 exposed by grinding does not change and variations in the area of the exposed surface 202b do not occur. Furthermore, since variations due to the degree of grinding do not occur in the area of the exposed surface 202b of the column 202, the degree of grinding can be increased to reduce the dimension of the semiconductor device A10 in the thickness direction Z. This, as a result, can produce a thinner semiconductor device A10.

The resin layer 22 is formed with a photosensitive polyimide resin by photolithography. That is, the resin layer 22 is formed by applying a photosensitive polyimide resin to all surfaces of the substrate material 100 on the front surface 110 side to form the resin layer 220, exposing the resin layer 220 with a predetermined pattern, and removing an exposed portion by development. This makes it possible to easily form the orthogonal surfaces 221a of the resin-layer through portion 221 which are flat surfaces orthogonal to the mounting surface 12. In addition, since the resin layer 22 as an insulator is interposed between the insulation layer 102 and the wiring section 20, the insulation between the base member 101 and the wiring section 20 can be even more reliable.

The semiconductor element 31 is a so-called flip-chip element, and is mounted on the substrate 1 by FCB. This allows for reduction in the dimension of the semiconductor device A10 in the thickness direction Z, as compared with the case where the semiconductor element 31 is mounted by wire bonding. This contributes to thinning of the semiconductor device A10.

The insulation film 24 covers all surfaces on the mounting surface 12 side in the semiconductor device A10 including the entire mounting surface 12, except for the area in which the electrode pad 26 is formed. This allows for electrical insulation between the substrate 1 and the electrode pad 26. It is also possible to electrically insulate the electrode pad 26 from other electrode pads 26. Furthermore, it is possible to prevent the material of the electrode pad 26 from being deposited on the mounting surface 12 when the electrode pad 26 is formed by electroless plating in the manufacturing process.

The wiring section 20 is made up of an underlying layer and a plating layer that are mutually laminated, and the underlying layer is made up of a Ti layer and a Cu layer that are mutually laminated. The Ti layer is in contact with the resin layer 22. The Ti layer favorably adheres to the resin layer 22 which is made of a synthetic resin, thereby advantageously preventing the Cu layer from peeling off from the resin layer 22. The underlying layer makes it possible to efficiently form the plating layer by electroplating when forming the wiring section 20 in the manufacturing process of the semiconductor device A10.

Second Embodiment

Figure 22:
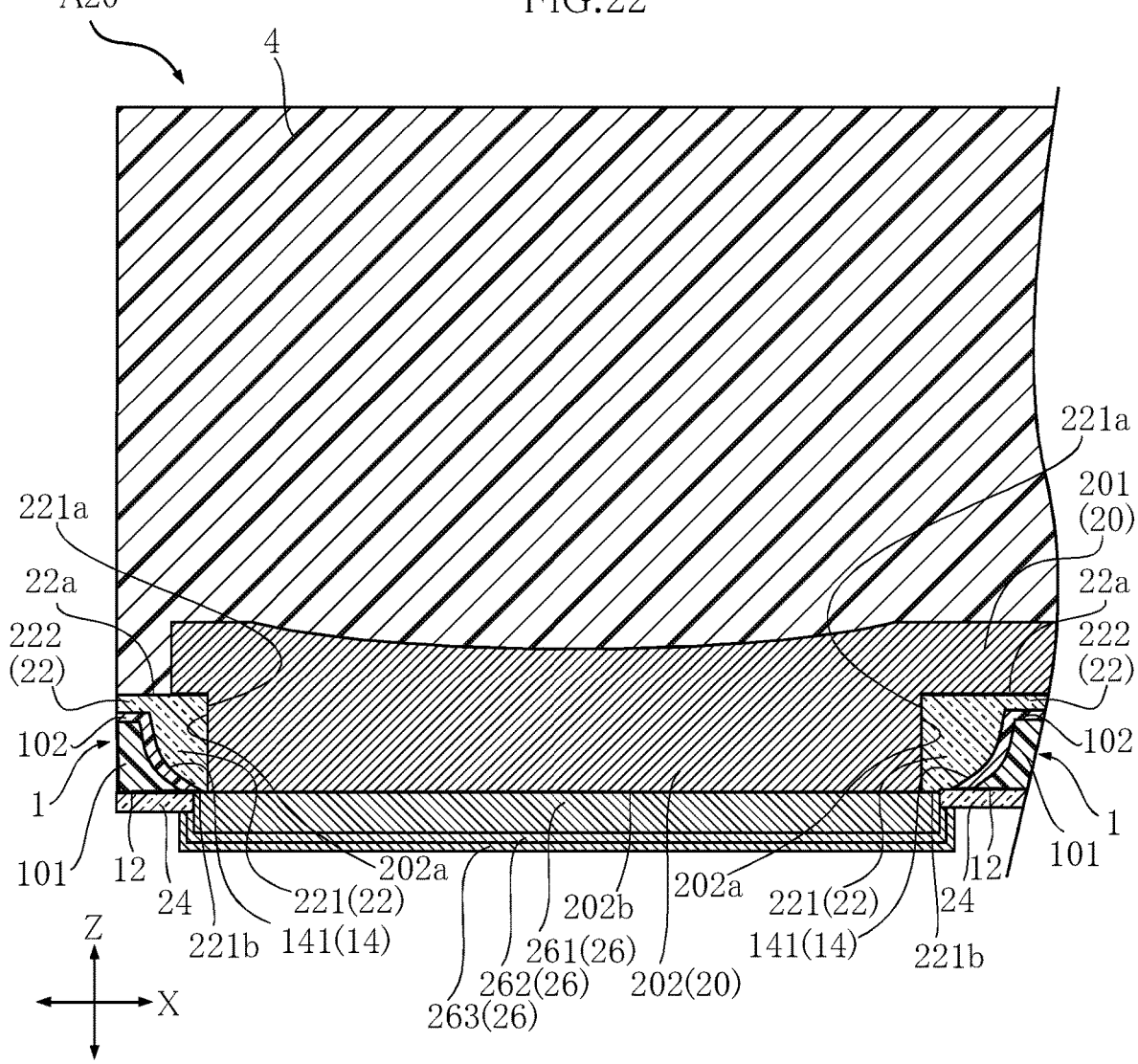
FIG. 22 is an enlarged cross-sectional view showing a main part of a semiconductor device according to a second embodiment of the present invention.

With reference to FIG. 22, a semiconductor device A20 according to a second embodiment of the present invention is described. In this figure, the same reference signs are given to elements that are the same as or similar to those in the semiconductor device A10 described above, and redundant descriptions are omitted.

FIG. 22 is an enlarged cross-sectional view showing a main part of the semiconductor device A20.

The semiconductor device A20 is different from the semiconductor device A10 in the shape of the inner walls 141 of the through-hole 14 in the substrate 1. The through-hole 14 according to the present embodiment is formed by isotropic etching with a solution of fluonitric acid (a mixed acid of HF and $HNO_3$) as an etching solution. Accordingly, each of the inner walls 141 of the through-hole 14 has a recessed shape, and the inclination to the thickness direction Z is not constant. The mounting surface 12 and the inner walls 141 form an angle of 90° near the front surface 11, but form a smaller angle near the mounting surface 12. However, the orthogonal surfaces 221a of the resin-layer through portion 221 are flat surfaces orthogonal to the mounting surface 12 regardless of the shape of the inner walls 141. Accordingly, the side surfaces 202a of the column 202 are also flat surfaces orthogonal to the mounting surface 12. Accordingly, the cross sections of the column 202 parallel to the mounting surface 12 all have the same shape regardless of the inclination of the inner walls 141 of the through-hole 14. Accordingly, even if the degree of grinding varies during the grinding step of the manufacturing process, the shape of the exposed surface 202b of the column 202 exposed by grinding does not change and variations in the area of the exposed surface 202b do not occur. That is, the present embodiment can also produce the same advantageous effect as the first embodiment.

Third Embodiment

With reference to FIGS. 23 to 28, a semiconductor device A30 according to a third embodiment of the present invention is described. In these figures, the same reference signs are given to elements that are the same as or similar to those in the semiconductor device A10 described above, and redundant descriptions are omitted.

Figure 23:
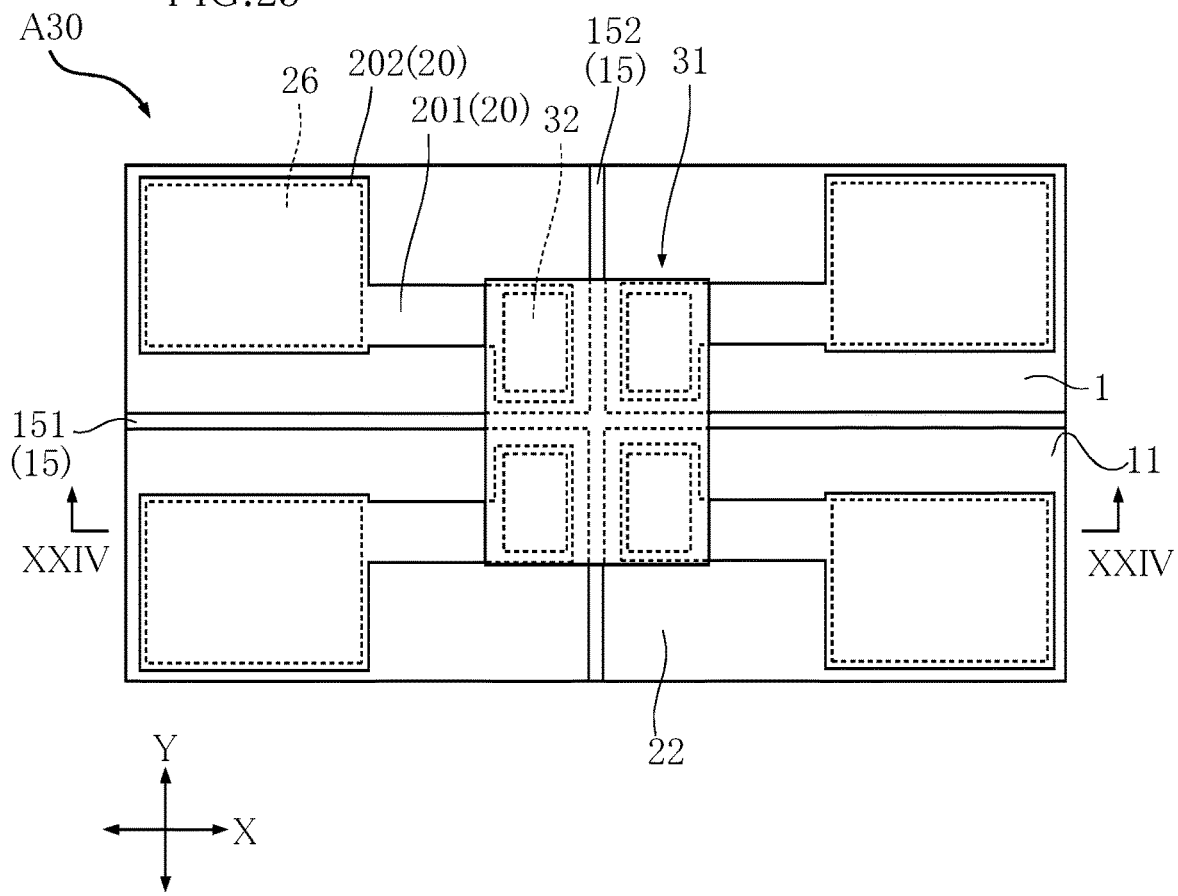
FIG. 23 is a plan view showing a semiconductor device according to a third embodiment of the present invention.
Figure 24:
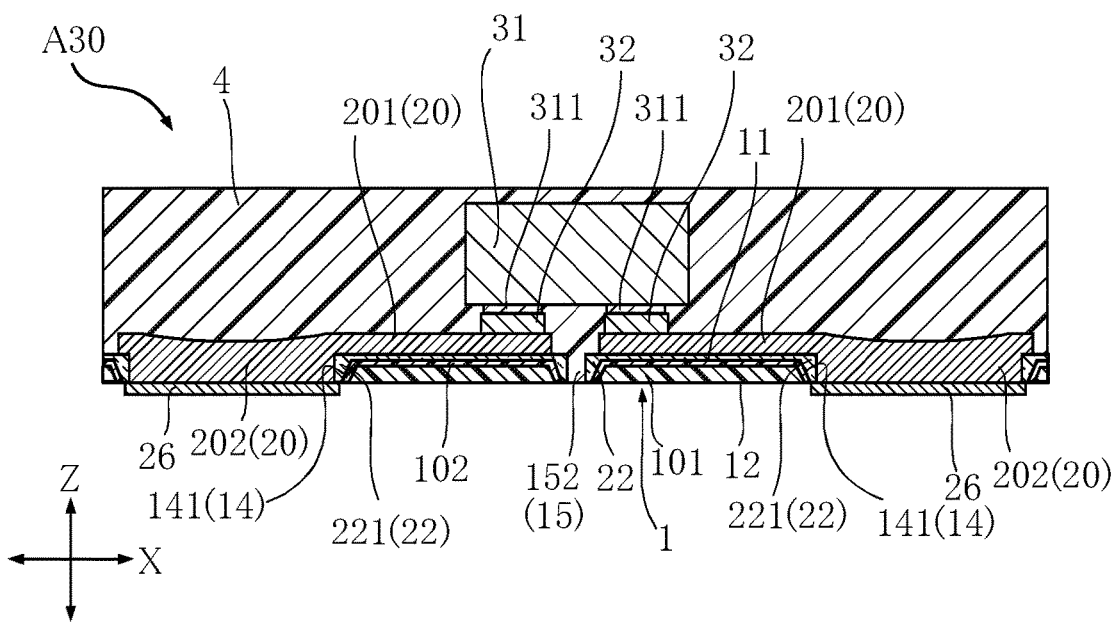
FIG. 24 is a cross-sectional view taken along line XXIV-XXIV in FIG. 23.

FIG. 23 is a plan view showing the semiconductor device A30, and the sealing resin 4 is shown transparent for ease of understanding. FIG. 24 is a cross-sectional view taken along line XXIV-XXIV of FIG. 23.

The semiconductor device A30 according to the present embodiment is different from the semiconductor device A10 in that the front surface 11 of the substrate 1 is formed with a groove 15 that penetrates to the mounting surface 12, and that the insulation film 24 is not formed.

As shown in FIGS. 23 and 24, the front surface 11 of the substrate 1 is formed with the groove 15. The groove 15 is made up of a groove 151 and a groove 152. The groove 151 passes through the center of the front surface 11, is parallel to the first direction X, and extends to both ends of the front surface 11 in the first direction X. The groove 152 passes through the center of the front surface 11, is parallel to the second direction Y, and extends to both ends of the front surface 11 in the second direction Y. That is, the groove 15 divides the front surface 11 into four regions. The groove 15 penetrates to the mounting surface 12, and is filled with the sealing resin 4. Each region of the substrate 1 divided by the groove 15 is provided with the wiring section 20. Each wiring section 20 is connected to the electrode pad 26 in the same region, and is connected to one of the electrode bumps 311 of the semiconductor element 31 via the corresponding bonding layer 32. Each region of the substrate 1 is electrically insulated from the other regions by the sealing resin 4 filled in the groove 15. Note that the arrangement and shape of the groove 15 are not limited, and are appropriately designed according to the arrangement and number of the electrode bumps 311 of the semiconductor element 31, and the arrangement of the electrode pads 26.

Next, an example of a method for manufacturing the semiconductor device A30 will be described with reference to FIGS. 25 to 28. In the following descriptions, descriptions common to those of the method for manufacturing the semiconductor device A10 according to the first embodiment will be omitted. FIGS. 25 to 28 are cross-sectional views for describing steps of manufacturing the semiconductor device A30.

First, a substrate material 100 is prepared, and a mask layer 801 is formed on a front surface 110. These steps are the same as those in the method for manufacturing the semiconductor device A10 (see FIG. 5) according to the first embodiment.

Figure 25:
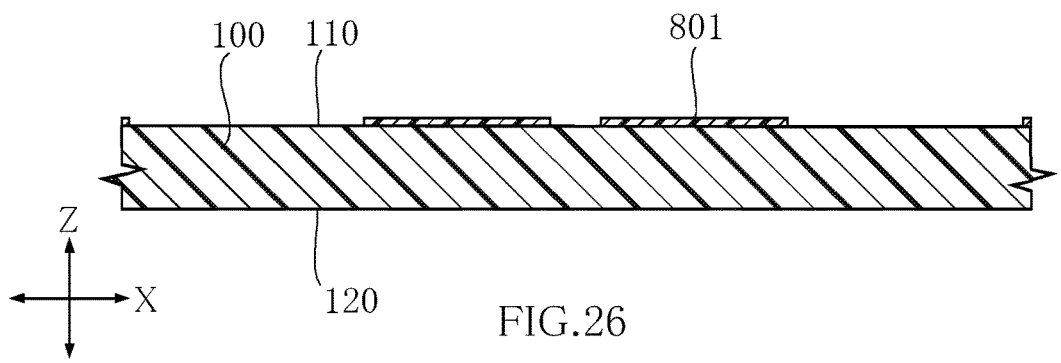
FIG. 25 is a cross-sectional view for describing a step of manufacturing the semiconductor device of FIG. 23.

Next, as shown in FIG. 25, the mask layer 801 is patterned by etching. As a result, the mask layer 801 is formed with openings. These openings include an opening for forming a through-hole 14 and an opening for forming a groove 15.

Figure 26:
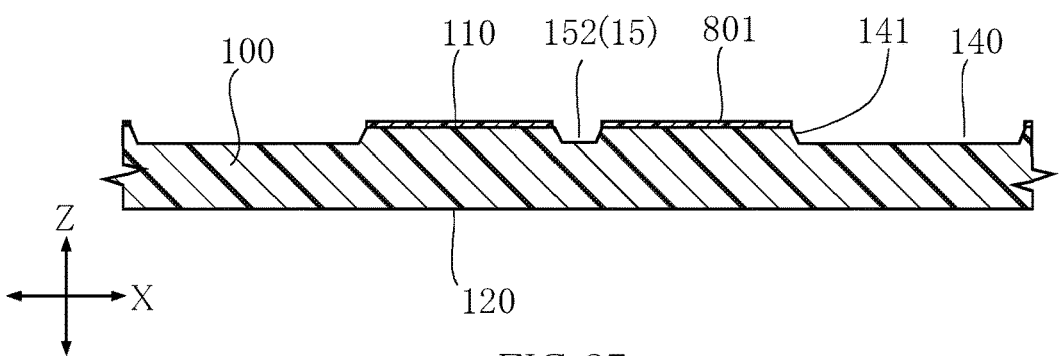
FIG. 26 is a cross-sectional view for describing a step of manufacturing the semiconductor device of FIG. 23.

Then, as shown in FIG. 26, a recess 140 and the groove 15 are formed. The recess 140 and the groove 15 are formed by anisotropic etching using KOH, for example. Thereafter, the mask layer 801 is removed.

Figure 27:
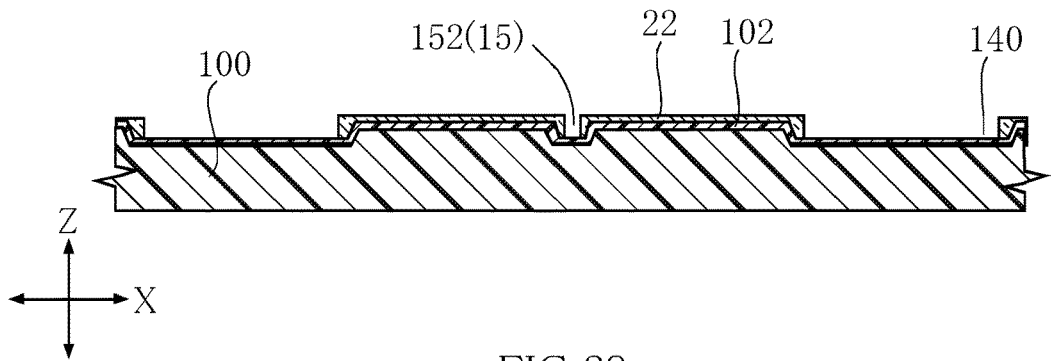
FIG. 27 is a cross-sectional view for describing a step of manufacturing the semiconductor device of FIG. 23.

Next, as shown in FIG. 27, an insulation layer 102 is formed and thereafter a resin layer 22 is formed. The insulation layer 102 is formed by thermal oxidation. The resin layer 22 is formed by photolithography. According to the present embodiment, portions of the resin layer 22 corresponding to the respective insides of the recess 140 and the groove 15 are removed.

Figure 28:
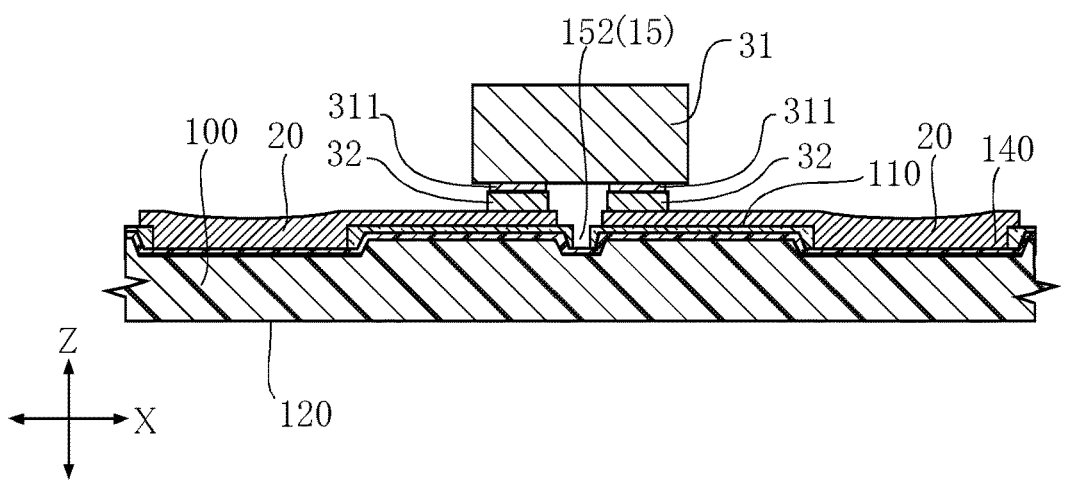
FIG. 28 is a cross-sectional view for describing a step of manufacturing the semiconductor device of FIG. 23.

Next, as shown in FIG. 28, a wiring section 20 and a bonding layer 32 are formed, and a semiconductor element 31 is mounted on the front surface 110. Next, a sealing resin 4 is formed to cover the semiconductor element 31. At this point, the groove 15 is filled with the sealing resin 4. Next, the substrate material 100 is ground from a back surface 120 by mechanical grinding, for example. As a result of grinding, a mounting surface 12 is formed, and an exposed surface 202b of a column 202 is exposed from the mounting surface 12. A portion of the sealing resin 4 filled in the groove 15 is also exposed from the mounting surface 12. As a result, the groove 15 penetrates to the mounting surface 12, and the sealing resin 4 filled in the groove 15 divides the substrate material 100. Next, an electrode pad 26 is formed to be in contact with the exposed surface 202b of the column 202 exposed to the outside from the substrate material 100. Next, the substrate material 100 and the sealing resin 4 are cut along the first direction X and the second direction Y, so that the substrate material 100 is divided into individual pieces that each correspond to the substrate 1 of the semiconductor device A40. The semiconductor devices A30 are manufactured through the above steps.

The present embodiment can also produce the same advantageous effect as the first embodiment. According to the present embodiment, the substrate 1 is divided into regions that are insulated from each other by the groove 15. Accordingly, there is no current path that connects these regions through the substrate 1. This prevents a short circuit between terminals of the semiconductor element 31 and improves robustness against a leak current.

In the present embodiment, an insulation film 24 is not formed since the sealing resin 4 in the groove can prevent a short circuit between the terminals of the semiconductor element 31. However, it is possible to form an insulation film 24 on the mounting surface 12 as seen in the first embodiment. Also, in the present embodiment, a side surface of the groove 15 is covered with the resin layer 22. However, the resin layer 22 does not need to cover the side surface of the groove 15 since the sealing resin 4 in the groove 15 can prevent a short circuit between the terminals of the semiconductor element 31.

Fourth Embodiment

Figure 29:
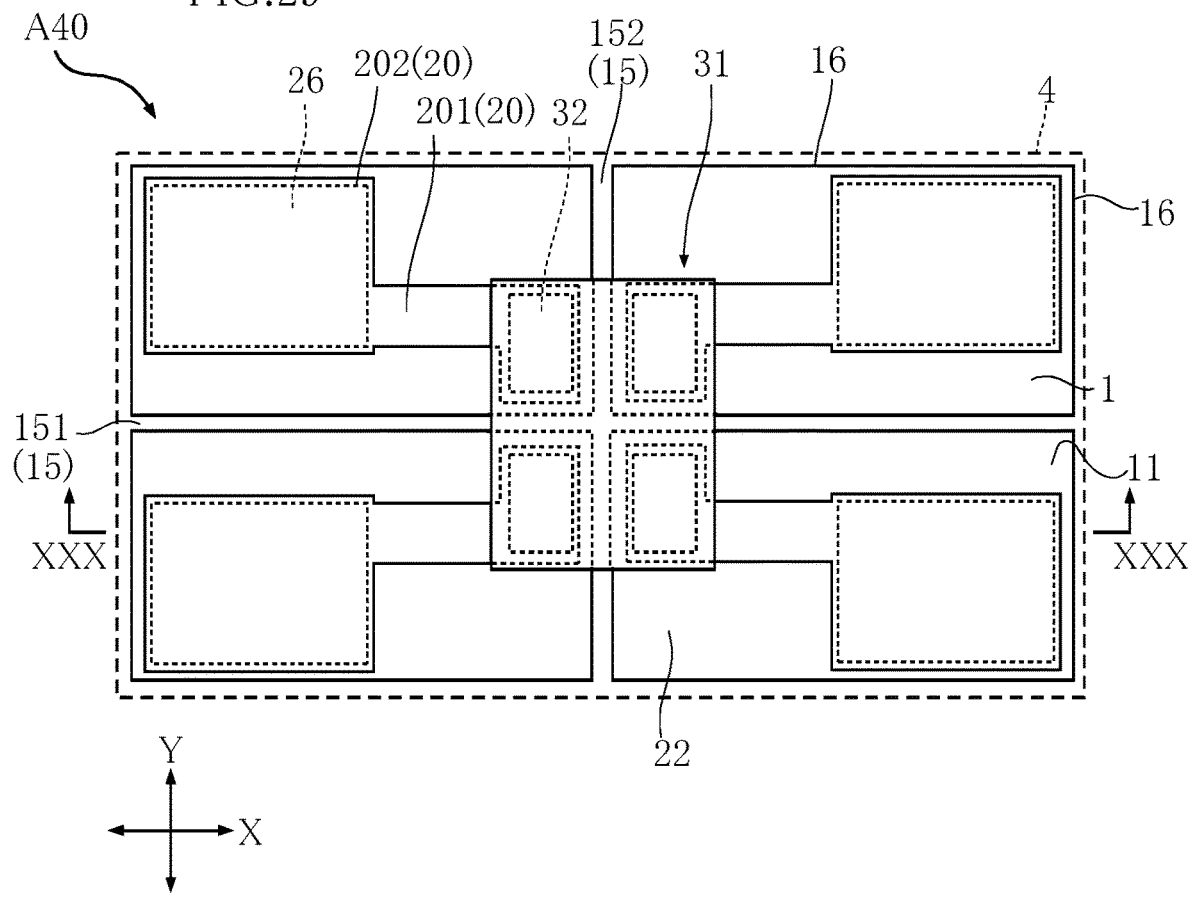
FIG. 29 is a plan view showing a semiconductor device according to a fourth embodiment of the present invention.
Figure 30:
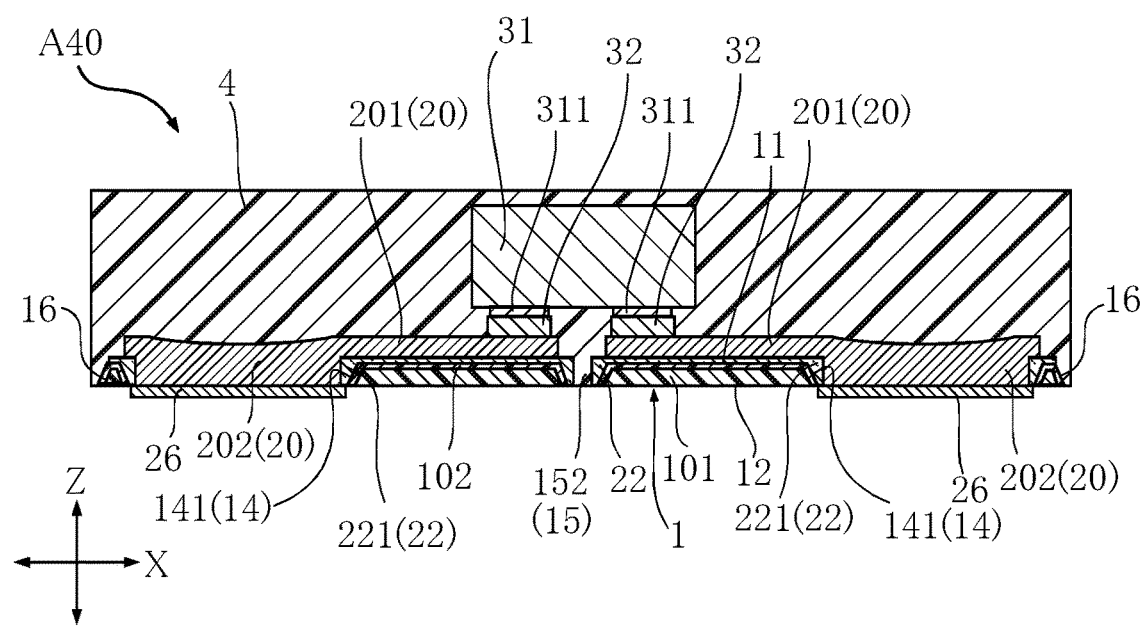
FIG. 30 is a cross-sectional view taken along line XXX-XXX in FIG. 29.

With reference to FIGS. 29 and 30, a semiconductor device A40 according to a fourth embodiment of the present invention is described. In these figures, the same reference signs are given to elements that are the same as or similar to those in the semiconductor device A30 described above, and redundant descriptions are omitted.

FIG. 29 is a plan view showing the semiconductor device A40, and the sealing resin 4 is shown transparent for ease of understanding. FIG. 30 is a cross-sectional view taken along line XXX-XXX of FIG. 29.

The semiconductor device A40 is different from the semiconductor device A30 in that the sealing resin 4 covers both end surfaces of the substrate 1 in the first direction X and both end surfaces of the substrate 1 in the second direction Y (these surfaces are hereinafter referred to as "side surfaces 16").

As shown in FIGS. 29 and 30, the side surfaces 16 of the substrate 1 are covered with the sealing resin 4. The side surfaces 16 are the end surfaces of the substrate 1 in the first direction X and the second direction Y. These surfaces correspond to the grooves formed along the cut lines when the substrate material 100 is cut into individual pieces during the manufacturing process. During the manufacturing process of the semiconductor device A40, the grooves are formed along the cut lines in the same manner as the groove 15. Each of the grooves is covered with the insulation layer 102 and filled with the sealing resin 4. Next, the substrate material 100 is ground from the back surface 120 so that portions of the sealing resin 4 filling the grooves are exposed from the mounting surface 12. As a result, the grooves penetrate to the mounting surface 12, and the sealing resin 4 filled in the grooves divides the substrate material 100. The substrate material 100 is then cut into individual pieces along the grooves. As a result, the side surfaces of the grooves become the side surfaces 16 covered with the sealing resin 4. Each of the side surfaces 16 of the substrate 1 is covered with the sealing resin 4, and this allows the substrate 1 to be completely covered with the sealing resin 4 except for the mounting surface 12.

The present embodiment can also produce the same advantageous effect as the first embodiment. The present embodiment can also improve robustness against a leak current since the substrate 1 is completely covered with the sealing resin 4 except for the mounting surface 12.

Although the insulation film 24 is not formed in the present embodiment, the insulation film 24 may be formed on the mounting surface 12 as seen in the first embodiment. Although the side surfaces 16 are not covered with the resin layer 22 in the present embodiment, the side surfaces 16 may also be covered with the resin layer 22. Furthermore, although the substrate 1 includes the groove 15 in the present embodiment, the groove 15 may be omitted.

Fifth Embodiment

Figure 31:
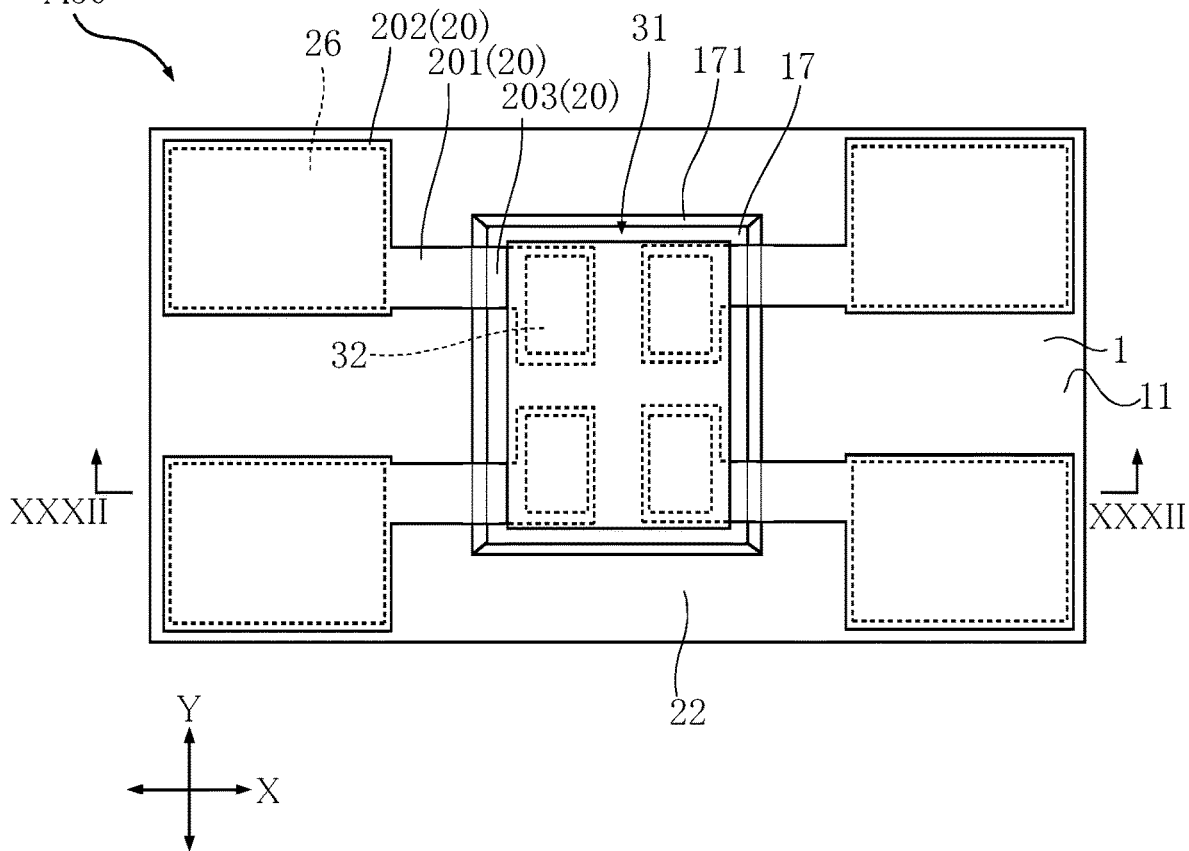
FIG. 31 is a plan view showing a semiconductor device according to a fifth embodiment of the present invention.
Figure 39:
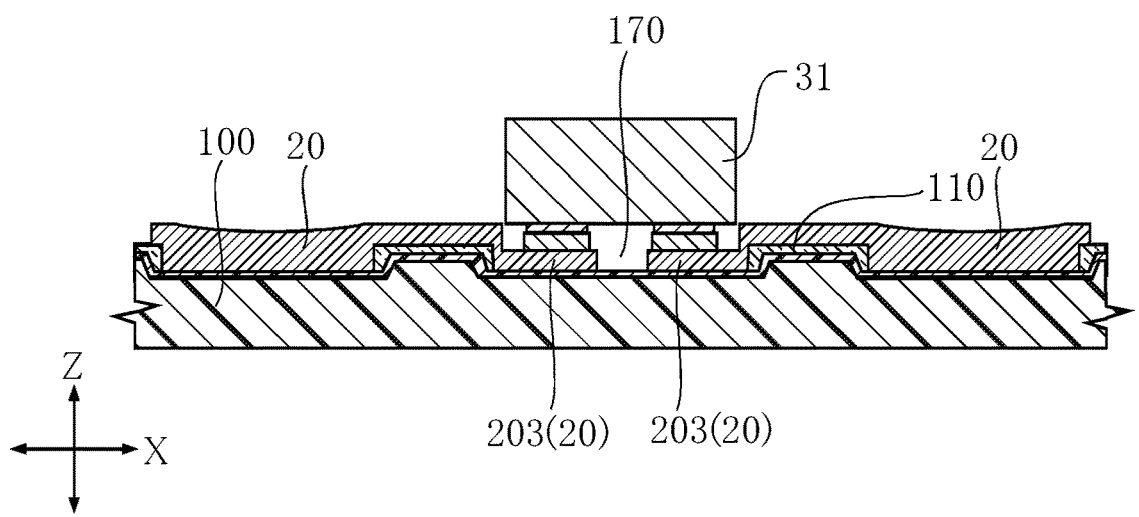
FIG. 39 is a cross-sectional view for describing a step of manufacturing the semiconductor device of FIG. 31.

With reference to FIGS. 31 and 39, a semiconductor device A50 according to a fifth embodiment of the present invention is described. In these figures, the same reference signs are given to elements that are the same as or similar to those in the semiconductor device A10 described above, and redundant descriptions are omitted.

Figure 32:
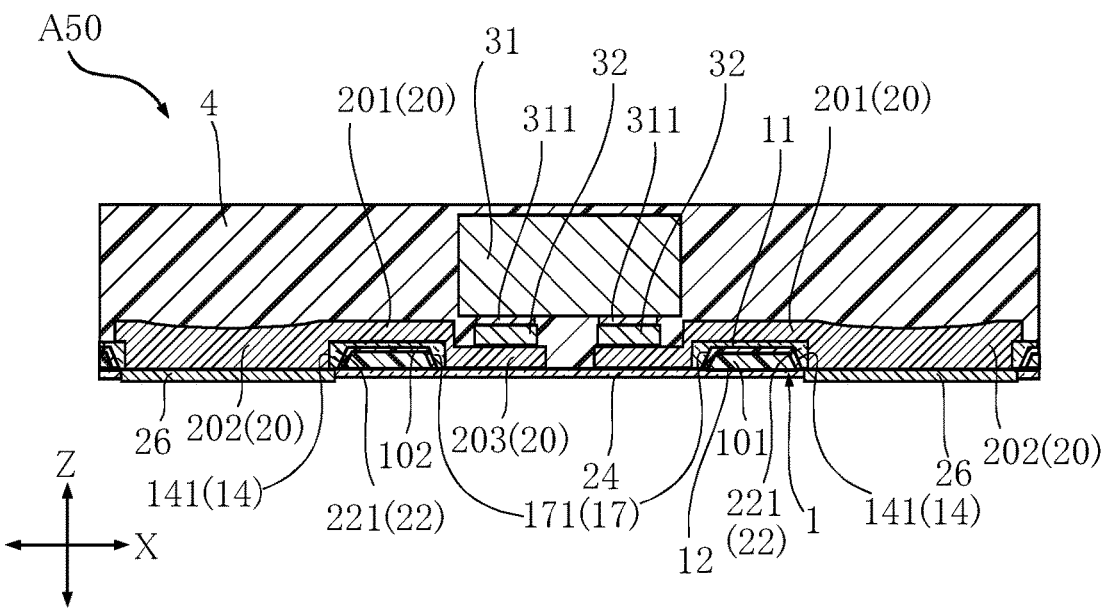
FIG. 32 is a cross-sectional view taken along line XXXII-XXXII in FIG. 31.

FIG. 31 is a plan view showing the semiconductor device A50, and the sealing resin 4 is shown transparent for ease of understanding. FIG. 32 is a cross-sectional view taken along line XXXII-XXXII of FIG. 31.

The semiconductor device A50 according to the present embodiment is different from the semiconductor device A10 in that a through-hole 17 is formed in the center of the front surface 11 of the substrate 1, and the semiconductor element 31 is arranged in the through-hole 17.

As shown in FIGS. 31 and 32, according to the present embodiment, the through-hole 17 is formed in the center of the substrate 1 and penetrates from the front surface 11 to the mounting surface 12. In the present embodiment, the through-hole 17 is rectangular as viewed in plan so as to correspond to the shape of the semiconductor element 31 as viewed in plan. The dimensions of the through-hole 17 at the front surface 11 and the mounting surface 12 are selected to receive the semiconductor element 31 therein. The through-hole 17 may have any shape and dimensions as long as the semiconductor element 31 can be arranged therein. The through-hole 17 is formed in the same manner as the through-hole 14. Accordingly, the inner walls 171 of the through-hole 17 are inclined to the thickness direction Z, and forms an angle of approximately 55° with the mounting surface 12. Accordingly, the cross sections of the through-hole 17 parallel to the mounting surface 12 are smaller in dimensions toward the mounting surface 12. The through-hole 17 is provided with a through-hole wiring line 203 connected to the front-surface wiring line 201. The semiconductor element 31 is arranged in the through-hole 17, and is connected to the through-hole wiring line 203 via the bonding layer 32.

Next, an example of a method for manufacturing the semiconductor device A50 will be described with reference to FIGS. 33 to 39. In the following descriptions, descriptions common to those of the method for manufacturing the semiconductor device A10 according to the first embodiment will be omitted. FIGS. 33 to 39 are cross-sectional views for describing steps of manufacturing the semiconductor device A50.

First, a substrate material 100 is prepared, and a mask layer 801 is formed on a front surface 110. These steps are the same as those in the method for manufacturing the semiconductor device A10 (see FIG. 5) according to the first embodiment.

Figure 33:
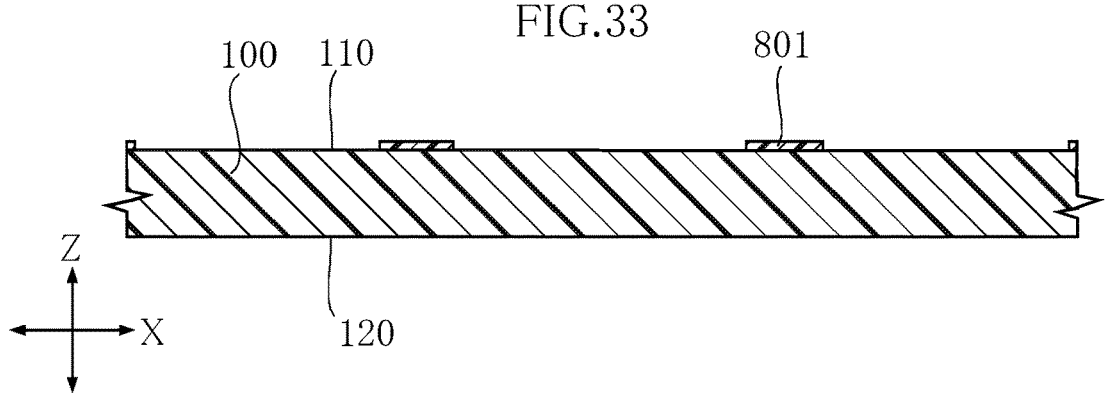
FIG. 33 is a cross-sectional view for describing a step of manufacturing the semiconductor device of FIG. 31.

Next, as shown in FIG. 33, the mask layer 801 is patterned by etching. As a result, the mask layer 801 is formed with openings. These openings include an opening for forming a through-hole 14 and an opening for forming a through-hole 17.

Figure 34:
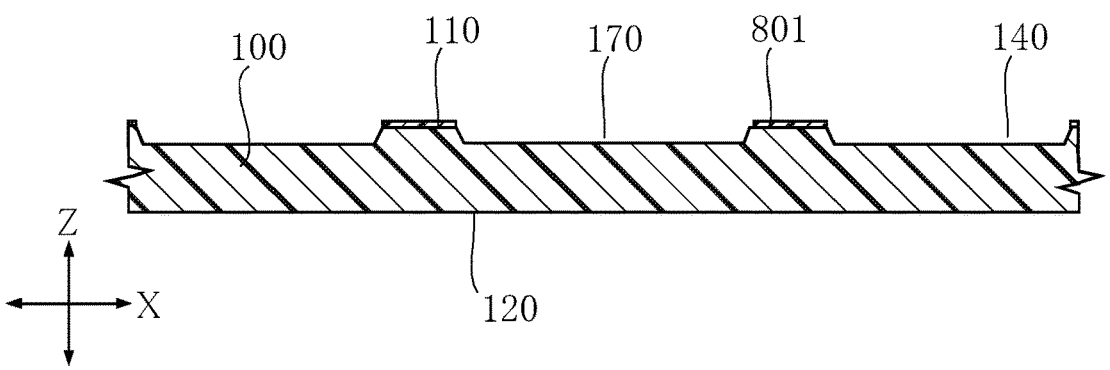
FIG. 34 is a cross-sectional view for describing a step of manufacturing the semiconductor device of FIG. 31.

Next, as shown in FIG. 34, a recess 140 and a recess 170 are formed. The recess 170 will ultimately become the through-hole 17. The recess 140 and the recess 170 are formed by anisotropic etching using KOH, for example. Thereafter, the mask layer 801 is removed.

Figure 35:
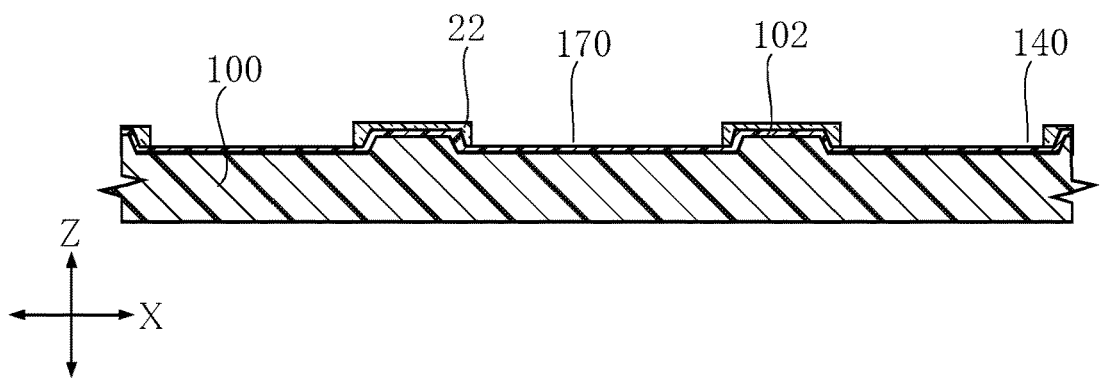
FIG. 35 is a cross-sectional view for describing a step of manufacturing the semiconductor device of FIG. 31.

Next, as shown in FIG. 35, an insulation layer 102 is formed and then a resin layer 22 is formed. The insulation layer 102 is formed by thermal oxidation. The resin layer 22 is formed by photolithography. According to the present embodiment, portions of the resin layer 22 corresponding to the respective insides of the recess 140 and the recess 170 are removed.

Figure 36:
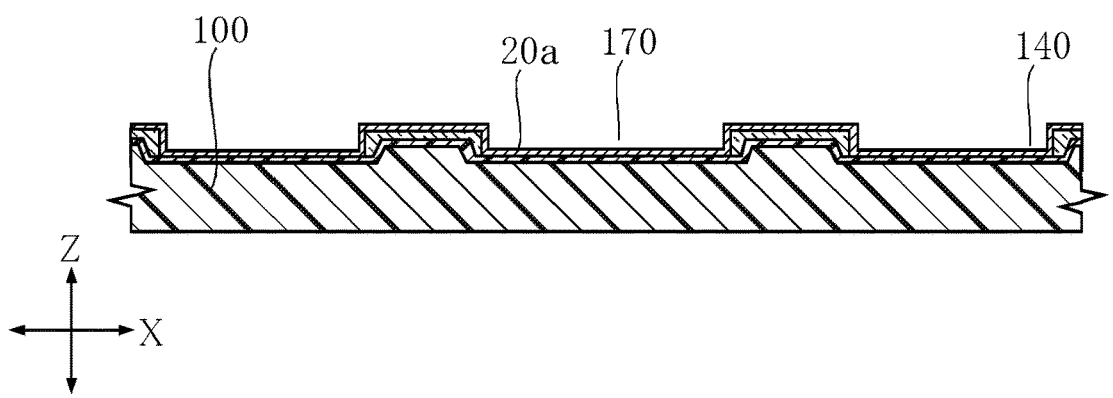
FIG. 36 is a cross-sectional view for describing a step of manufacturing the semiconductor device of FIG. 31.
Figure 37:
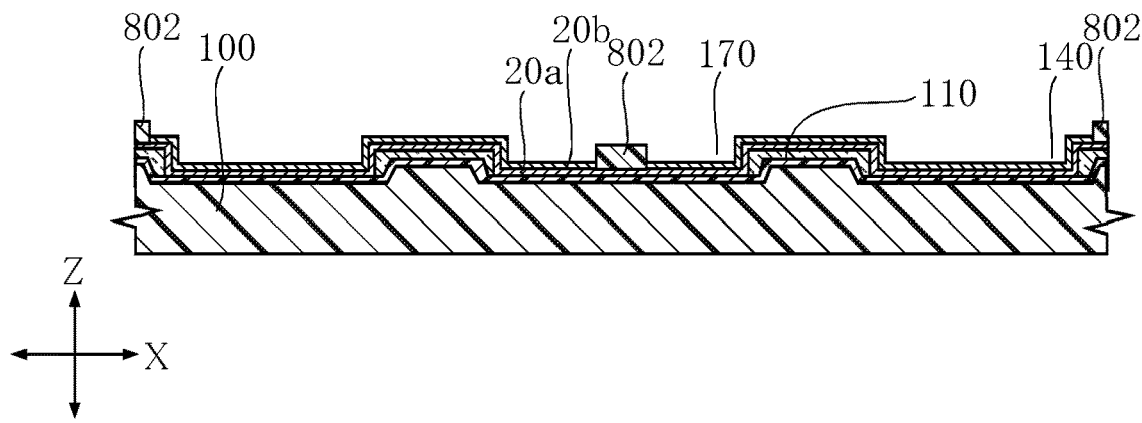
FIG. 37 is a cross-sectional view for describing a step of manufacturing the semiconductor device of FIG. 31.
Figure 38:
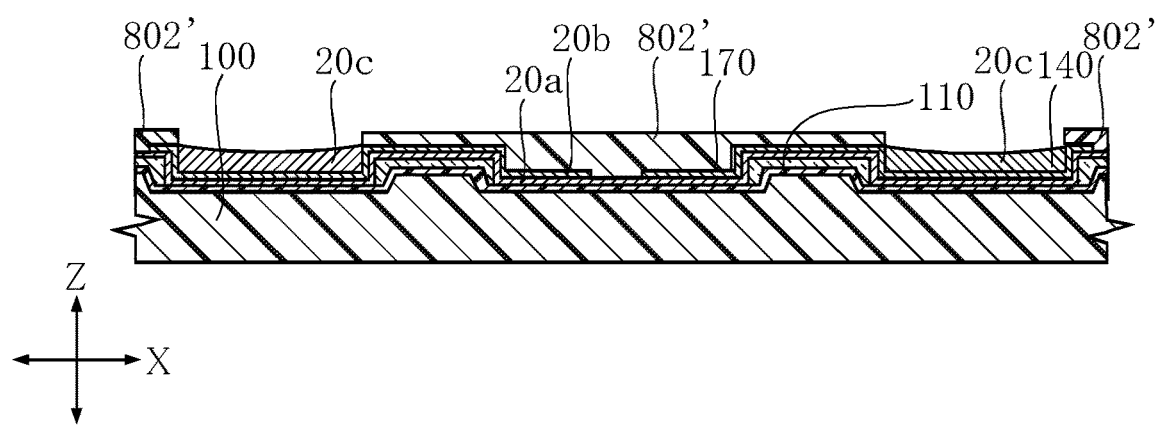
FIG. 38 is a cross-sectional view for describing a step of manufacturing the semiconductor device of FIG. 31.

Next, a wiring section 20 is formed as shown in FIGS. 36 to 38. First, an underlying layer 20a is formed as shown in FIG. 36. Next, as shown in FIG. 37, a mask layer 802 for forming a plating layer 20b is formed, and the plating layer 20b is formed to be in contact with the underlying layer 20a exposed from the mask layer 802. During this process, the plating layer 20b is formed to be thin and uniform. Thereafter, the mask layer 802 is removed. Next, as shown in FIG. 38, a mask layer 802' for forming a plating layer 20c is formed, and the plating layer 20c is formed to be in contact with the plating layer 20b exposed from the mask layer 802'. The plating layer 20c is formed at a portion that will ultimately become a column 202. Unlike in the first embodiment, the step of forming the plating layers (20b and 20c) is divided into two stages so that the thickness of a through-hole wiring line 203 (dimension in the thickness direction Z) is prevented from being too thick. Next, the mask layer 802' is removed, and a bonding layer 32 is formed. Thereafter, all unnecessary portions of the underlying layer 20a not covered with the plating layer 20b are removed. The remaining portions of the underlying layer 20a, the plating layer 20b, and the plating layer 20c are integrated into the wiring section 20.

Next, as shown in FIG. 39, a semiconductor element 31 is mounted on the front surface 110. Next, a sealing resin 4 is formed to cover the semiconductor element 31. At this point, the recess 170 is also filled with the sealing resin 4. Next, the substrate material 100 is ground from a back surface 120 by mechanical grinding, for example. As a result of grinding, a mounting surface 12 is formed, and an exposed surface 202b of the column 202 is exposed from the mounting surface 12. A portion of the sealing resin 4 filled in the recess 170 is also exposed from the mounting surface 12. The bottom surface of the recess 170 is ground and removed so that the recess 170 becomes the through-hole 17. Next, an insulation film 24 is formed to cover the mounting surface 12 of the substrate material 100. In the present embodiment, the through-hole wiring line 203 and the sealing resin 4, which are exposed from the mounting surface 12, are also covered with the insulation film 24. Next, an electrode pad 26 is formed in an opening 241 of the insulation film 24 such that the electrode pad 26 is in contact with the exposed surface 202b of the column 202. Next, the substrate material 100 and the sealing resin 4 are cut along the first direction X and the second direction Y, so that the substrate material 100 is divided into individual pieces that each correspond to the substrate 1 of the semiconductor device A50. The semiconductor devices A50 are manufactured through the above steps.

The present embodiment can also produce the same advantageous effect as the first embodiment. According to the present embodiment, the semiconductor element 31 is arranged in the through-hole 17. This makes it possible to reduce the thickness of the semiconductor device A50 (dimension in the thickness direction Z) as compared to the case where the semiconductor element 31 is arranged on the front surface 11 of the substrate 1. This contributes to thinning of the semiconductor device.

Although the through-hole 17 penetrates the substrate 1 in the present embodiment, other variations are possible. For example, the recess 170 may be formed to be shallower than the recess 140 during the manufacturing process. In this way, even when the recess 140 becomes the through-hole 14 by grinding, the recess 170 can be prevented from being penetrated, thus leaving the substrate 1 at the bottom surface of the recess 170. In order to form the recess 170 to be shallower than the recess 140, the etching step can be performed in two stages, for example.

Sixth Embodiment

Figure 40:
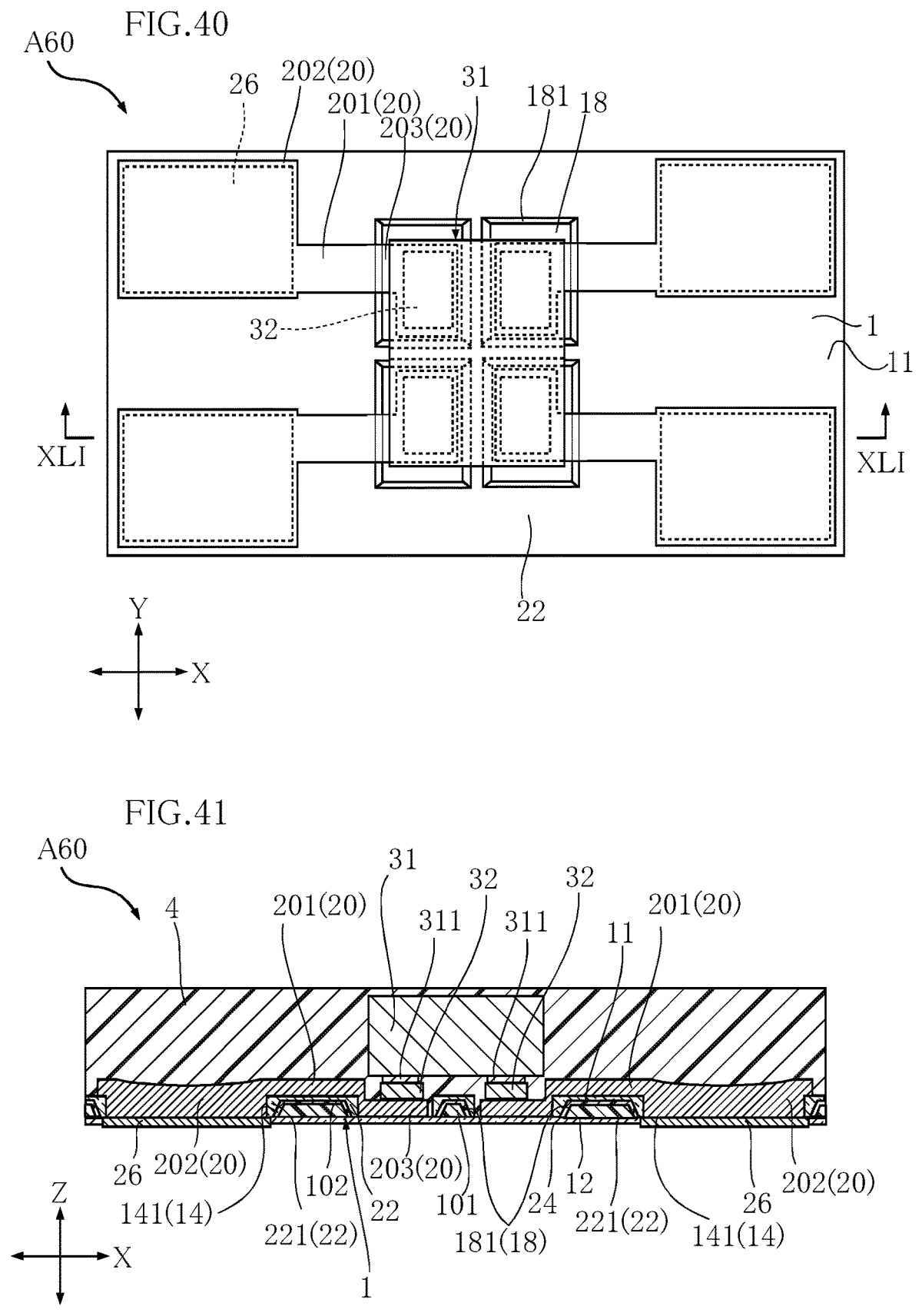

With reference to FIGS. 40 and 41, a semiconductor device A60 according to a sixth embodiment of the present invention is described. In these figures, the same reference signs are given to elements that are the same as or similar to those in the semiconductor device A10 described above, and redundant descriptions are omitted.

FIG. 40 is a plan view showing the semiconductor device A60, and the sealing resin 4 is shown transparent for ease of understanding. FIG. 41 is a cross-sectional view taken along line XLI-XLI of FIG. 40.

The semiconductor device A60 includes four through-holes 18 formed in the front surface 11 of the substrate 1. Each of the through-holes 18 is formed with a different one of the bonding layers 32 that connect to the electrode bumps 311 of the semiconductor element 31. The semiconductor device A60 is formed with four through-holes 18 in each of which a bonding layer 32 and an electrode bump 311 are arranged, unlike the semiconductor device A50 according to the fifth embodiment, which is formed with a single through-hole 17 in which the entirety of the semiconductor element 31 is arranged.

As shown in FIGS. 40 and 41, the substrate 1 according to the present embodiment is formed with four through-holes 18 that penetrate from the front surface 11 to the mounting surface 12. In the present embodiment, the four through-holes 18 are rectangular and arranged to correspond to the positions of the four electrode bumps 311 of the semiconductor element 31. The number, arrangement, shape, and dimensions of the through-holes 18 can be appropriately selected according to the number, arrangement, shape, and dimensions of the electrode bumps 311 of the semiconductor element 31. The through-holes 18 are formed in the same manner as the through-hole 17 according to the fifth embodiment. Accordingly, the inner walls 181 of the through-holes 18 are inclined to the thickness direction Z, and form an angle of approximately 55° with the mounting surface 12. Accordingly, the cross sections of the through-holes 18 parallel to the mounting surface 12 are smaller in dimensions toward the mounting surface 12. Each of the through-holes 18 is formed with a through-hole wiring line 203 connected to a front-surface wiring line 201. The semiconductor element 31 is arranged such that the electrode bumps 311 are positioned within the through-holes 18, whereby the semiconductor element 31 is connected to the through-hole wiring lines 203 via the bonding layers 32.

The present embodiment can also produce the same advantageous effect as the first embodiment. According to the present embodiment, the bonding layers 32 and the electrode bumps 311 are arranged within the through-holes 18. This makes it possible to reduce the thickness of the semiconductor device A60 (dimension in the thickness direction Z) as compared to the case where the semiconductor element 31 is arranged on the front surface 11 of the substrate 1. This contributes to thinning of the semiconductor device. Furthermore, since a portion of the substrate 1 remains between each pair of the through-holes 18, the semiconductor device A60 can be strengthened as compared to the structure where the entirety of the semiconductor element 31 is arranged in the single through-hole 17 as described in the fifth embodiment.

Although the through-holes 18 penetrate the substrate 1 according to the present embodiment, they can be formed so as not to penetrate the substrate 1 to leave portions of the substrate 1.

Seventh Embodiment

Figure 42:
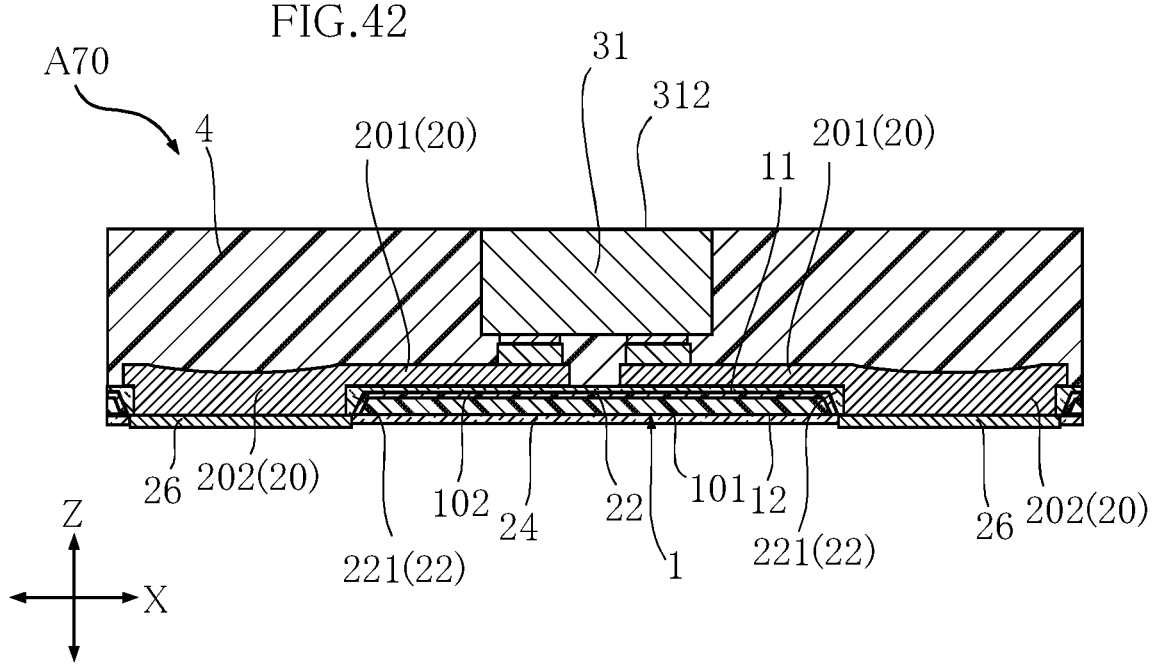
FIG. 42 is a cross-sectional view showing a semiconductor device according to a seventh embodiment of the present invention.

With reference to FIG. 42, a semiconductor device A70 according to a seventh embodiment of the present invention is described. In these figures, the same reference signs are given to elements that are the same as or similar to those in the semiconductor device A10 described above, and redundant descriptions are omitted.

FIG. 42 is a cross-sectional view showing the semiconductor device A70, and corresponds to FIG. 3 in the first embodiment.

The semiconductor device A70 according to the present embodiment is different from the semiconductor device A10 in that the element front surface 312 of the semiconductor element 31 is exposed from the top surface of the sealing resin 4.

As shown in FIG. 42, the element front surface 312 of the semiconductor element 31 is exposed from the top surface of the sealing resin 4. During the manufacturing process according to the present embodiment, a step of forming the sealing resin 4 (corresponding to the step shown in FIG. 18 in the first embodiment) is performed to form the sealing resin 4 in such a manner that the sealing resin 4 does not cover the top surface of the semiconductor element 31. Alternatively, the sealing resin 4 can be formed in the same manner as in the first embodiment (see FIG. 18), and then the surface located opposite from the back surface 120 of the substrate material 100 (the top surface of the sealing resin 4) can be ground by mechanical grinding, for example, to expose the element front surface 312 of the semiconductor element 31 from the top surface of the sealing resin 4. In this case, it is possible to grind a portion of the sealing resin on the element front surface 312 of the semiconductor element 31.

The present embodiment can also produce the same advantageous effect as the first embodiment. Furthermore, according to the present embodiment, the thickness of the semiconductor device A70 (dimension in the thickness direction Z) can be reduced as compared to the case where the element front surface 312 of the semiconductor element 31 is covered with the sealing resin 4. This contributes to thinning of the semiconductor device.

Eighth Embodiment

Figure 43:
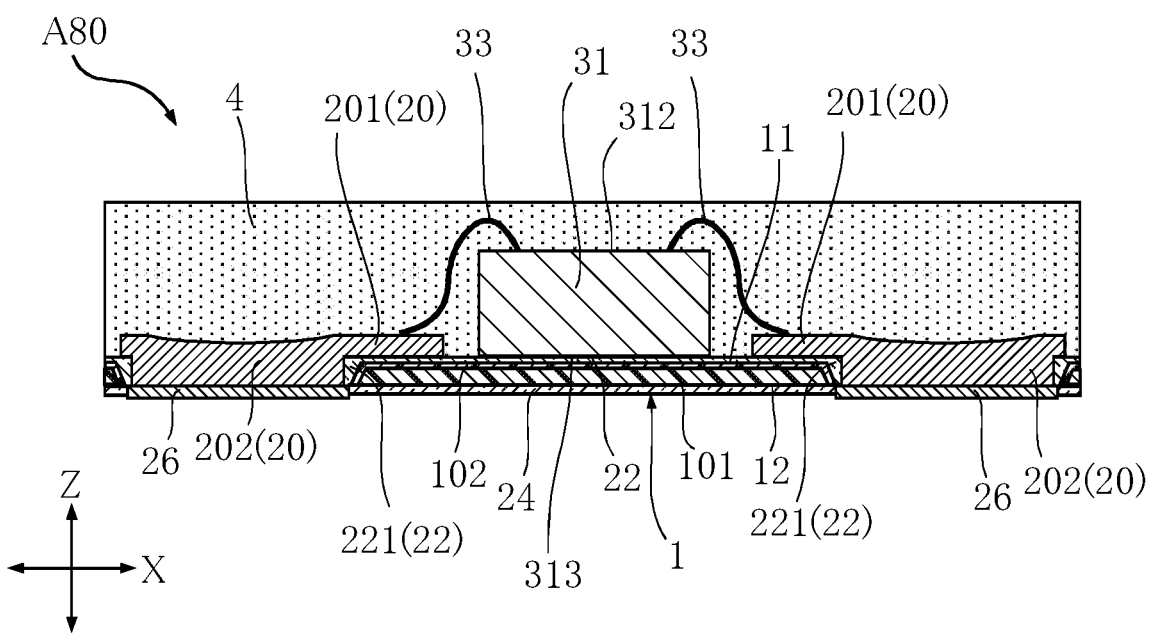
FIG. 43 is a cross-sectional view showing a semiconductor device according to an eighth embodiment of the present invention.

With reference to FIG. 43, a semiconductor device A80 according to an eighth embodiment of the present invention is described. In this figure, the same reference signs are given to elements that are the same as or similar to those in the semiconductor device A10 described above, and redundant descriptions are omitted.

FIG. 43 is a cross-sectional view showing the semiconductor device A80, and corresponds to FIG. 3 in the first embodiment.

The semiconductor device A80 is different from the semiconductor device A10 in that the semiconductor element 31 is a wire-bonding element. The semiconductor element 31 is mounted on the front surface 11 of the substrate 1, and each of the electrodes formed on the element front surface 312 of the semiconductor element 31 is connected to a front-surface wiring line 201 by a wire 33.

The present embodiment can also produce the same advantageous effect as the first embodiment. Furthermore, according to the present embodiment, the front-surface wiring line 201, the bonding layer 32, and the electrode bump 311 are not provided between the semiconductor element 31 and the substrate 1. This makes it possible to arrange the semiconductor element 31 closer to the substrate 1 in the thickness direction Z (closer to the mounting surface of the semiconductor device A80).

Ninth Embodiment

Figure 44:
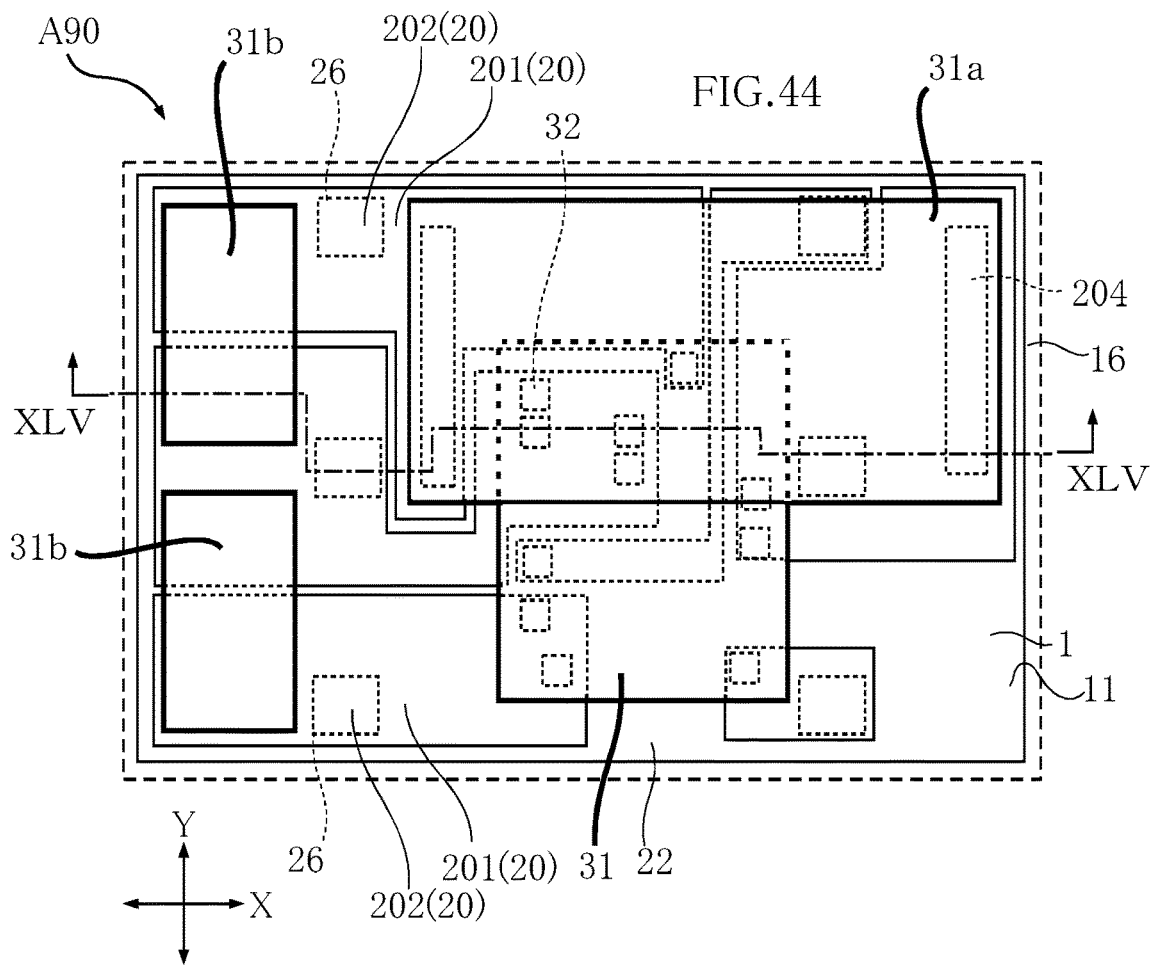
FIG. 44 is a plan view showing a semiconductor device according to a ninth embodiment of the present invention.
Figure 45:
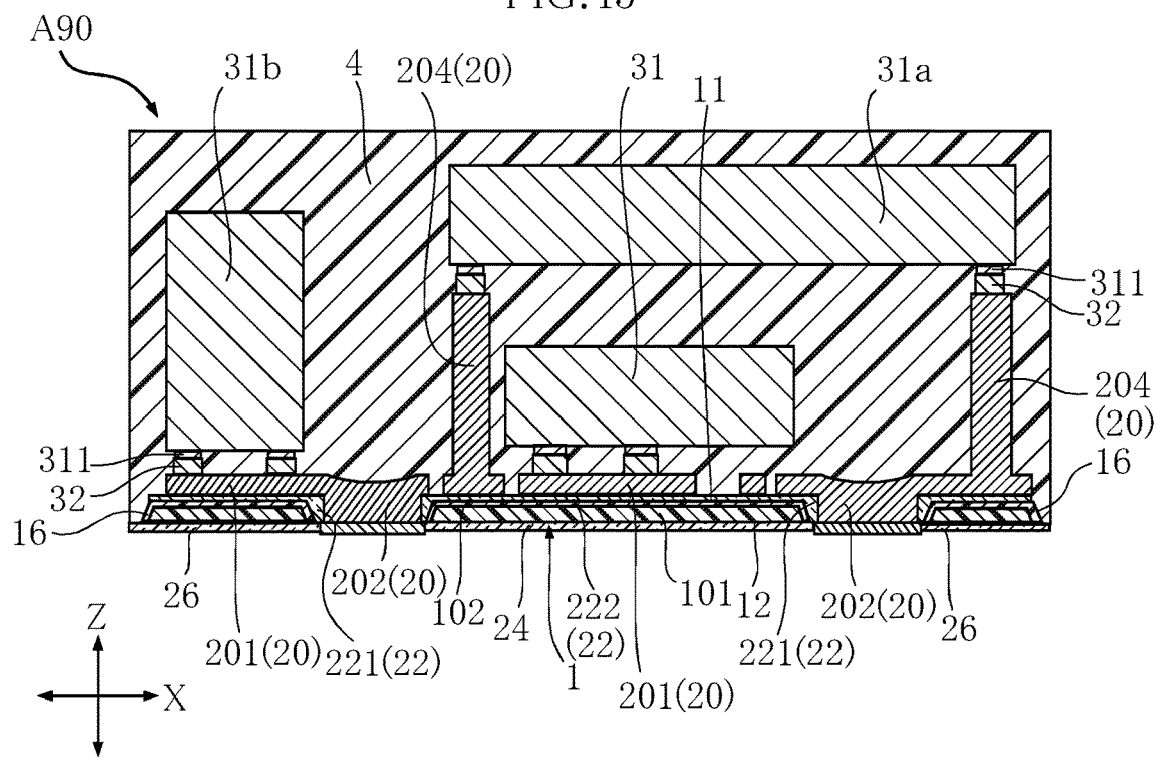
FIG. 45 is a cross-sectional view taken along line XLV-XLV of FIG. 44.

With reference to FIGS. 44 and 45, a semiconductor device A90 according to a ninth embodiment of the present invention is described. In these figures, the same reference signs are given to elements that are the same as or similar to those in the semiconductor device A10 described above, and redundant descriptions are omitted.

FIG. 44 is a plan view showing the semiconductor device A90, and the sealing resin 4 is shown transparent for ease of understanding. FIG. 45 is a cross-sectional view taken along line XLV-XLV of FIG. 44.

The semiconductor device A90 according to the present embodiment further includes an inductor and a capacitor mounted on the front surface 11 of the substrate 1. Furthermore, in the semiconductor device A90, the side surfaces 16 of the substrate 1 are covered with the sealing resin 4 as seen in the fourth embodiment.

As shown in FIGS. 44 and 45, the front surface 11 of the substrate 1 according to the present embodiment has the semiconductor element 31, an inductor 31a, and two capacitors 31b mounted thereon. The wiring section 20 includes a column 204.

The column 204 stands from the front-surface wiring line 201 in the thickness direction Z. The column 204 has a rectangular parallelepiped shape and is made of Cu. In the present embodiment, in order to arrange the inductor 31a in an area above the semiconductor element 31 (i.e., area located opposite from the substrate 1 with the semiconductor element 31 therebetween), two columns 204 are provided apart from the semiconductor element 31, and sandwich the semiconductor element 31 in the first direction X. During the manufacturing process, the columns 204 are formed in a step subsequent to the step of forming the plating layer 20b (see FIG. 14). Specifically, a mask layer for forming the columns 204 is formed by photolithography. Then, electroplating using the underlying layer 20a and the plating layer 20b as a conductive path is performed to fill the openings of the mask layer. As a result, the columns 204 are formed in contact with the plating layer 20b. The bonding layers 32 are formed on the respective top surfaces of the columns 204 (the surfaces facing opposite from the substrate 1).

As shown in FIG. 45, the inductor 31a is arranged above the semiconductor element 31 and spans across the top surfaces of the two columns 204. According to the present embodiment, the inductor 31a is a flip-chip choke coil. As shown in FIG. 45, the electrode bumps 311 are formed at the lower end of the inductor 31a. The electrode bumps 311 are made of Al, for example. The electrode bumps 311 are in contact with the bonding layers 32 formed on the top surfaces of the columns 204. The inductor 31a is mounted in the same manner as the semiconductor element 31 after the semiconductor element 31 is mounted in the step of mounting the semiconductor element 31 (see FIG. 17).

As shown in FIG. 44, the two capacitors 31b are positioned in an area located on one side of the semiconductor element 31 in the first direction X (left in FIG. 44), and are arranged side by side in the second direction Y. The capacitors 31b are flip-chip elements. As shown in FIG. 45, the lower end of each capacitor 31b is provided with electrode bumps 311. The electrode bumps 311 are made of Al, for example. The electrode bumps 311 are in contact with the bonding layers 32 that are in contact with the front-surface wiring line 201. The capacitors 31b are mounted in the same manner as the semiconductor element 31 during the step of mounting the semiconductor element 31 (see FIG. 17).

The present embodiment can also produce the same advantageous effect as the first embodiment. Furthermore, according to the present embodiment, the semiconductor device A90 includes the inductor 31a and the capacitors 31b. This eliminates the need to separately provide a circuit board with an inductor and a capacitor for connecting to the semiconductor element 31 when the semiconductor device A90 is mounted on the circuit board.

Tenth Embodiment

With reference to FIGS. 46 to 55, a semiconductor device A100 according to a tenth embodiment of the present disclosure is described. In these figures, the same reference signs are given to elements that are the same as or similar to those in the semiconductor device A10 described above, and redundant descriptions are omitted.

Figure 46:
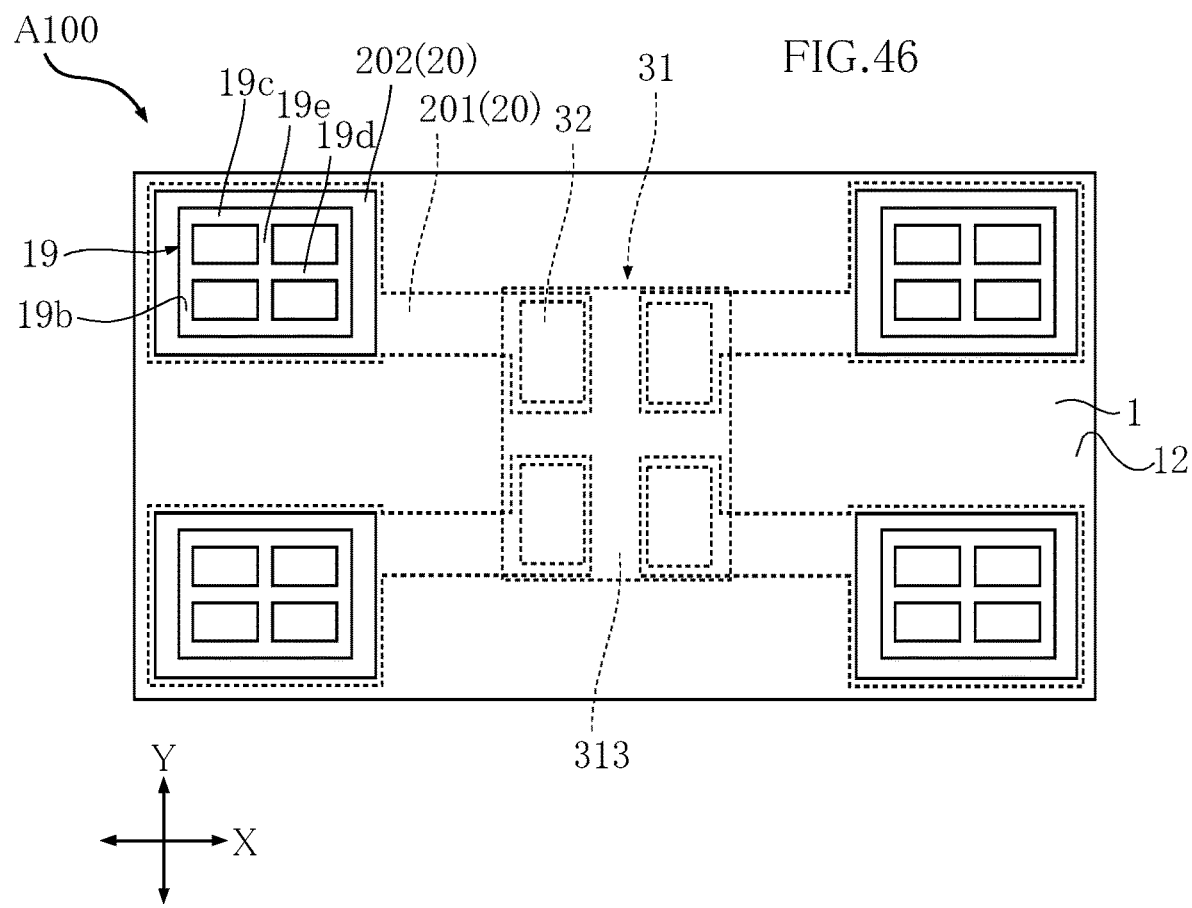
FIG. 46 is a bottom view showing a semiconductor device according to a tenth embodiment of the present invention.
Figure 47:
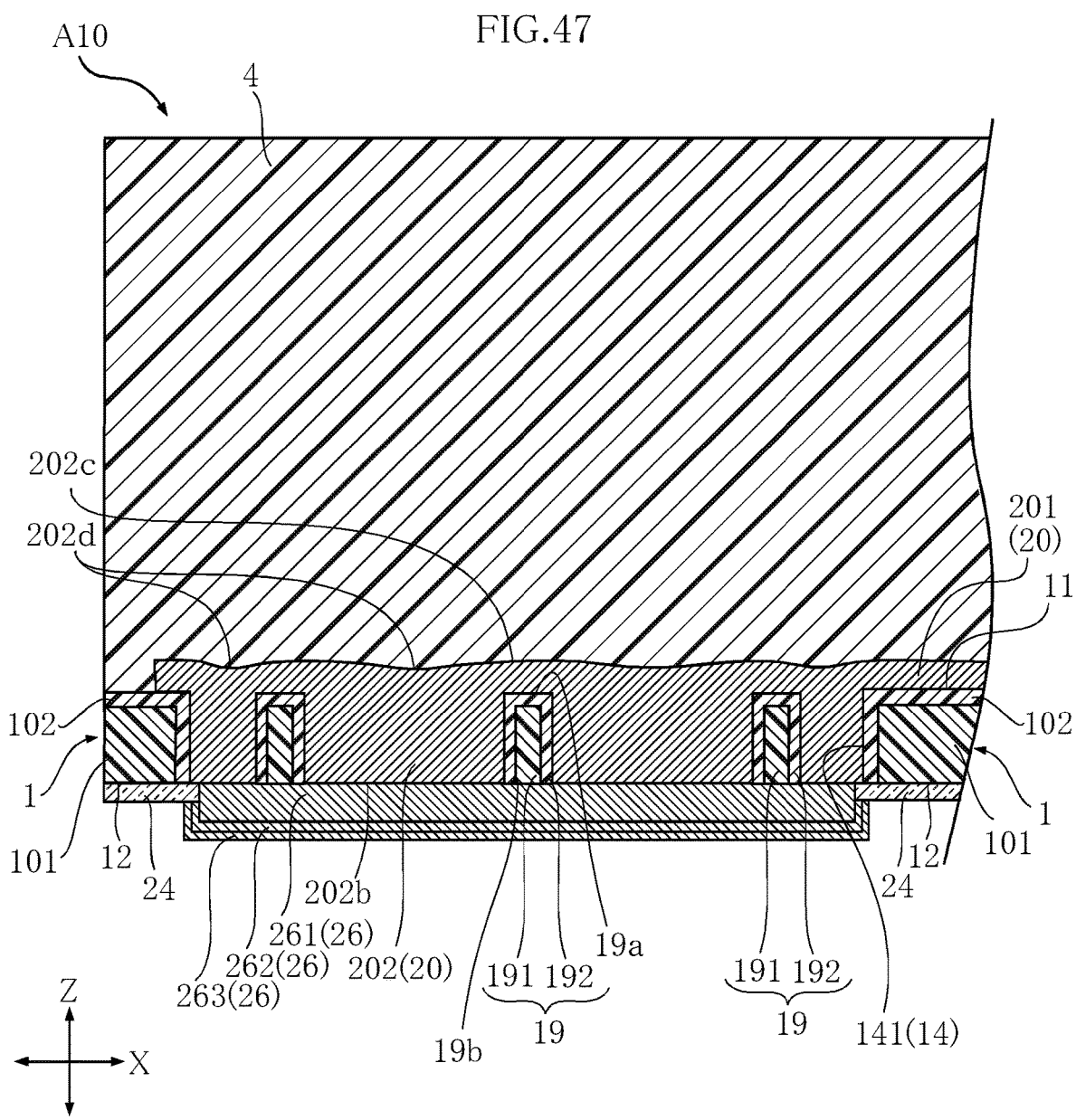
FIG. 47 is an enlarged cross-sectional view showing a main part of the semiconductor device of FIG. 46.

FIG. 46 is a bottom view showing the semiconductor device A100, and corresponds to FIG. 2 in the first embodiment. In FIG. 46, the insulation film 24 and the electrode pad 26 are shown transparent for ease of understanding. FIG. 47 is an enlarged cross-sectional view showing a main part of the semiconductor device A100, and corresponds to FIG. 4 in the first embodiment.

The semiconductor device A100 according to the present embodiment is different from the semiconductor device A10 in that the column 202 is divided by a divider 19 near the exposed surface 202b. In the present embodiment, the inner walls 141 of the through-hole 14 are not inclined to the thickness direction Z. Also, in the present embodiment, the semiconductor device A100 does not include the resin layer 22.

The divider 19 divides a portion of the column 202, which is located within the through-hole 14 and near the exposed surface 202b, into a plurality of portions. As shown in FIG. 47, the divider 19 includes a base member 191 and an insulation layer 192. The base member 191 is made of the same material as the base member 101 of the substrate 1, and is chiefly made of Si, for example. The insulation layer 192 is formed on the base member 191, and covers the surfaces of the base member 191 that are seen from the opposite side of the mounting surface 12 of the substrate 1. In the present embodiment, the insulation layer 192 is made of $SiO_2$, and is formed by thermally oxidizing the base member 191. Note that the divider 19 does not necessarily include the insulation layer 192.

As shown in FIG. 47, the divider 19 has the same dimension as the substrate 1 in the thickness direction Z. The divider 19 has a front surface 19a and a back surface 19b. The front surface 19a and the back surface 19b face opposite from each other in the thickness direction Z. The front surface 19a faces upward in FIG. 47, and is flush with the front surface 11 of the substrate 1. The back surface 19b faces downward in FIG. 47, and is flush with the mounting surface 12 of the substrate 1. The back surface 19b is also flush with the exposed surface 202b of the column 202, and is exposed from the column 202. In contrast, the front surface 19a is not exposed from the column 202.

As shown in FIG. 46, the divider 19 has a lattice shape in plan view, and includes an outer peripheral partition wall 19c, a first inner partition wall 19d, and a second inner partition wall 19e. The outer peripheral partition wall 19c has a rectangular frame shape in plan view. The portion of the column 202 near the exposed surface 202b is divided into a portion inside the outer peripheral partition wall 19c and a portion outside the outer peripheral partition wall 19c. The first inner partition wall 19d extends in the first direction X within the outer peripheral partition wall 19c, and both ends of the first inner partition wall 19d in the first direction X extend to the respective inner surfaces of the outer peripheral partition wall 19c. The second inner partition wall 19e extends in the second direction Y within the outer peripheral partition wall 19c, and both ends of the second inner partition wall 19e in the second direction Y extend to the respective inner surfaces of the outer peripheral partition wall 19c. As a result, the portion of the column 202 near the exposed surface 202b within the outer peripheral partition wall 19c is divided into four areas. This means that the portion of the column 202 near the exposed surface 202b is divided in five areas in total. Since the back surface 19b of the divider 19 is flush with the exposed surface 202b of the column 202, the exposed surface 202b of the column 202 is divided into five areas. Note that the divider 19 may take any shape in plan view.

The column 202 has a front surface 202c facing opposite from the exposed surface 202b. In the present embodiment, the front surface 202c is formed with a plurality of recesses 202d that are recessed toward the exposed surface 202b. The recesses 202d are formed at respective positions that, in plan view, overlap with the areas divided by the divider 19. In plan view, the recesses 202d are relatively small in area. As a result of this, the recesses 202d are relatively small in depth (in dimension in the thickness direction Z). If the divider 19 is not provided, only a single recess is formed in the front surface 202c. In this case, the area of the recess is relatively large, and as a result of this, the depth is relatively large as well (see FIG. 4).

Next, an example of a method for manufacturing the semiconductor device A100 will be described with reference to FIGS. 48 to 53. In the following descriptions, descriptions common to those of the method for manufacturing the semiconductor device A10 according to the first embodiment will be omitted. FIG. 48, and FIGS. 50 to 53 are cross-sectional views for describing steps of manufacturing the semiconductor device A100. FIG. 49 is a plan view for describing a step of manufacturing the semiconductor device A100.

Figure 48:
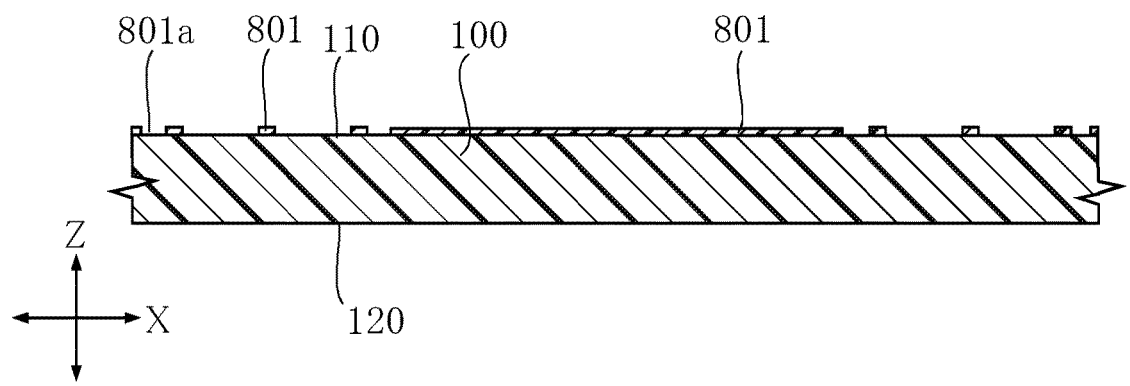
FIG. 48 is a cross-sectional view for describing a step of manufacturing the semiconductor device of FIG. 46.
Figure 49:
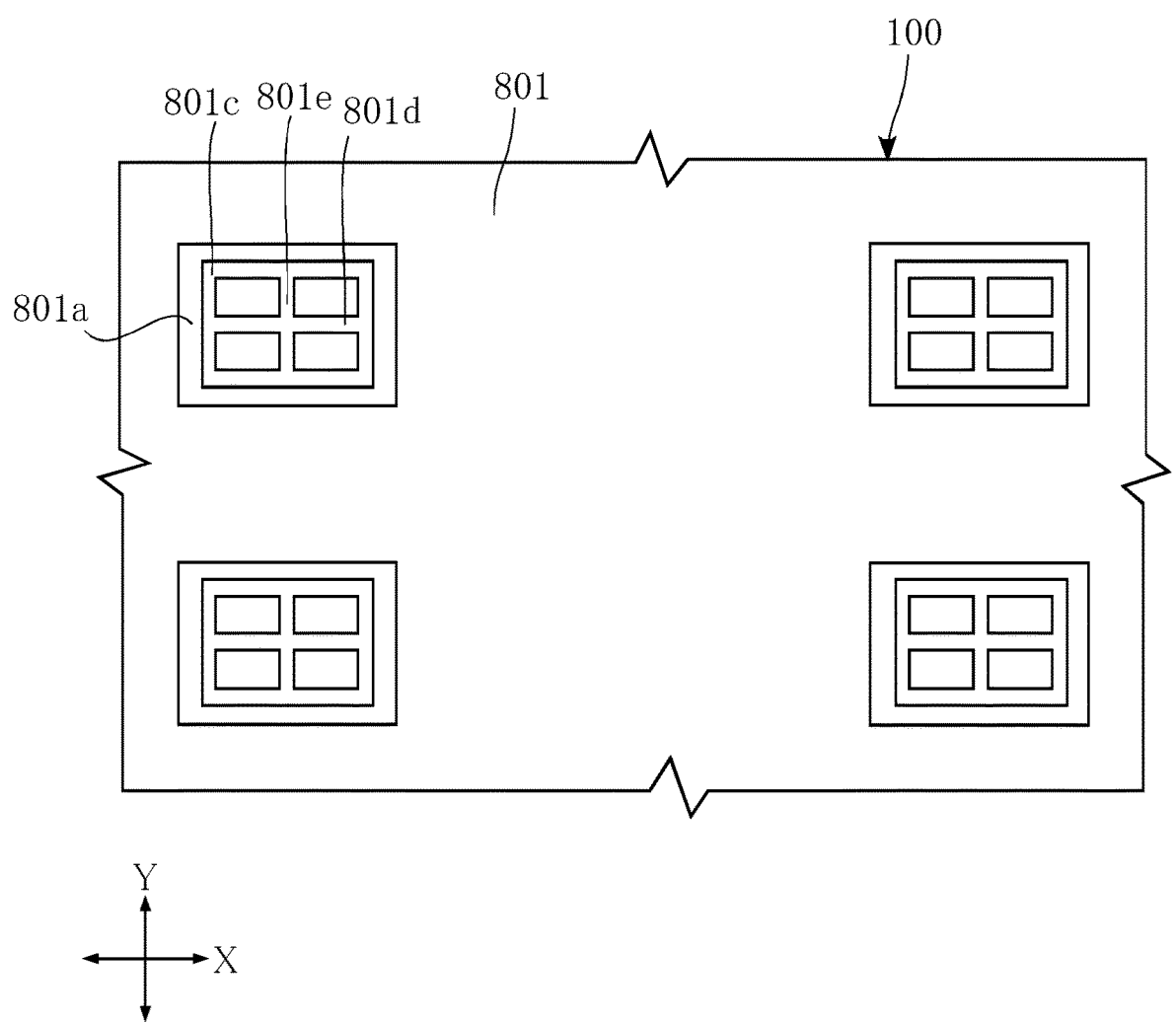
FIG. 49 is a plan view for describing a step of manufacturing the semiconductor device of FIG. 46.

First, as shown in FIGS. 48 and 49, a substrate material 100 is prepared, and a front surface 110 thereof is thermally oxidized to form a mask layer 801 made of $SiO_2$. Then, the mask layer 801 is patterned by etching. During this process, the mask layer 801 is left in a lattice pattern within an opening 801a for forming a through-hole 14 as viewed in plan. Portions covered with remaining portions 801c, 801d, and 801e of the mask layer 801, which are shown in FIG. 49, remain to ultimately become an outer peripheral partition wall 19c, a first inner partition wall 19d, and a second inner partition wall 19e, respectively.

Figure 50:
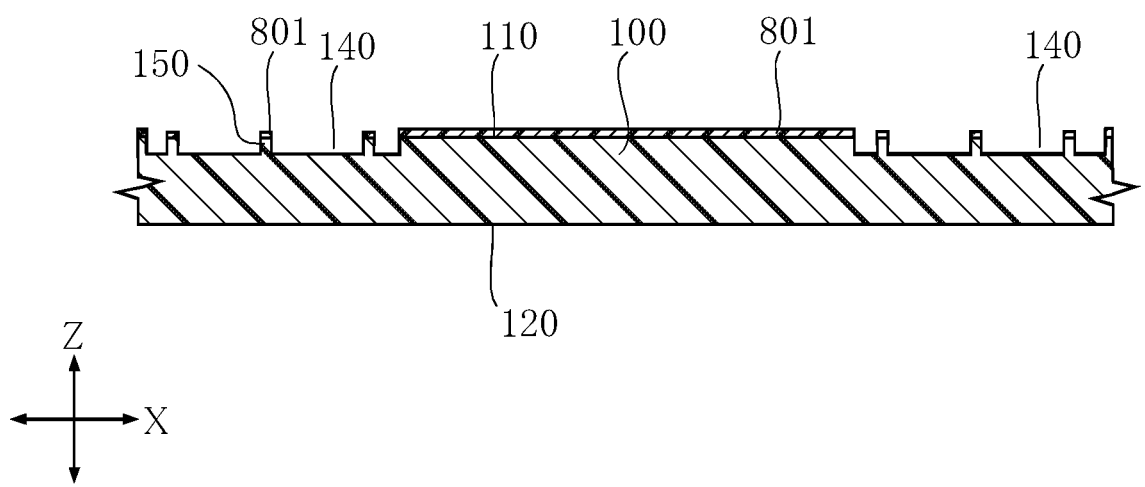
FIG. 50 is a cross-sectional view for describing a step of manufacturing the semiconductor device of FIG. 46.

Next, as shown in FIG. 50, a recess 140 is formed. The recess 140 is formed by dry etching using the Bosch process, for example. During this process, a portion of the substrate material 100, which has a lattice pattern in plan view, remains within the recess 140 (this portion is referred to as "remaining portion 150" hereinafter). A portion of the remaining portion 150 will ultimately become a divider 19.

Figure 51:
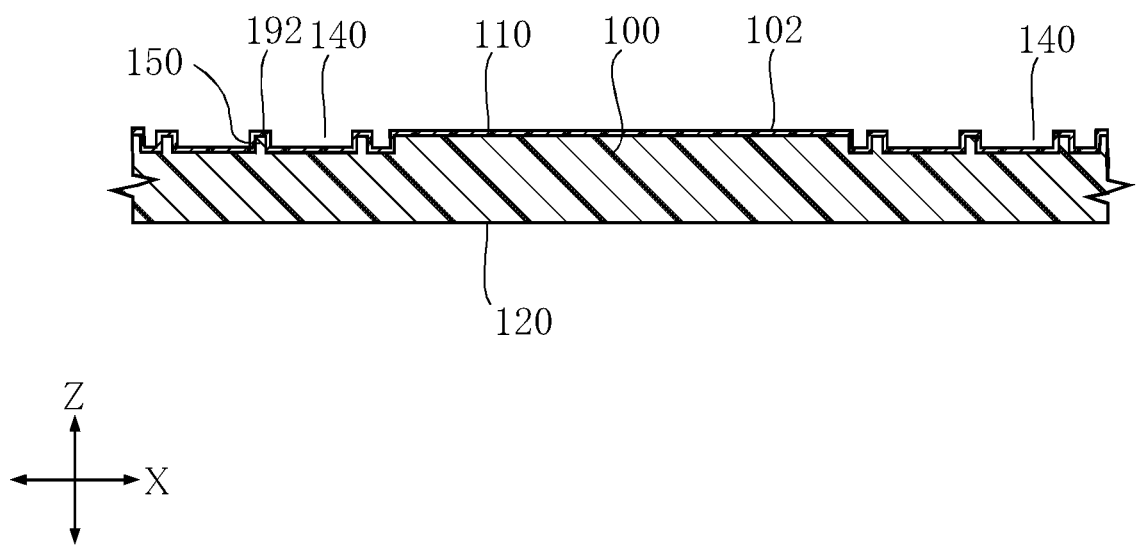
FIG. 51 is a cross-sectional view for describing a step of manufacturing the semiconductor device of FIG. 46.
Figure 54:
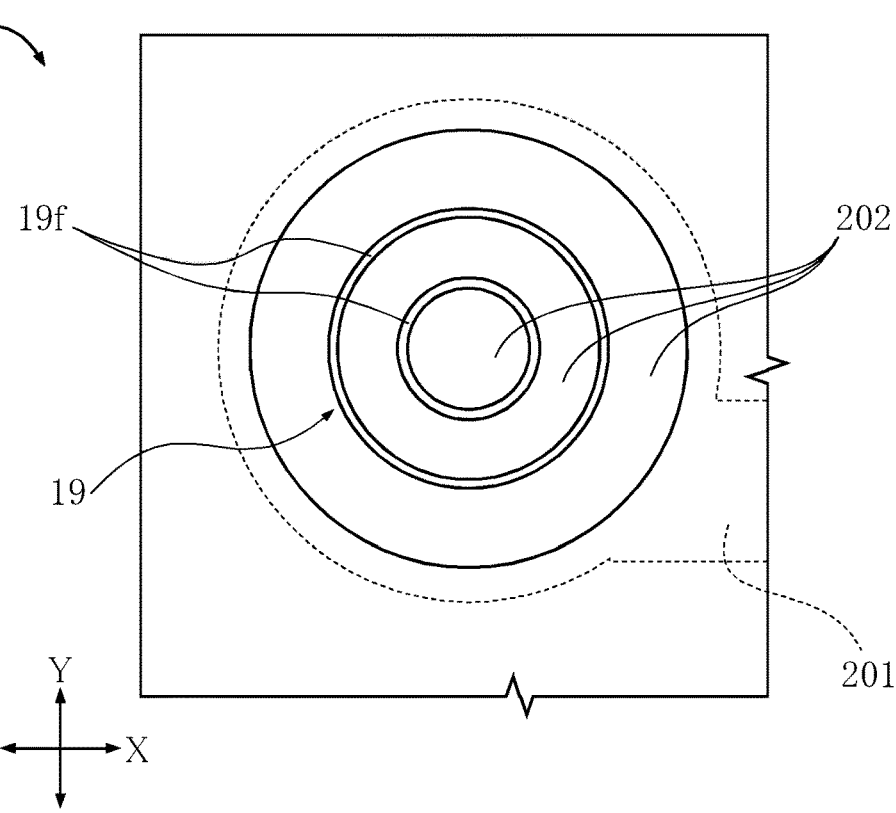
FIG. 54 is an enlarged bottom view showing a main part of a variation of the semiconductor device of FIG. 46.
Figure 55:
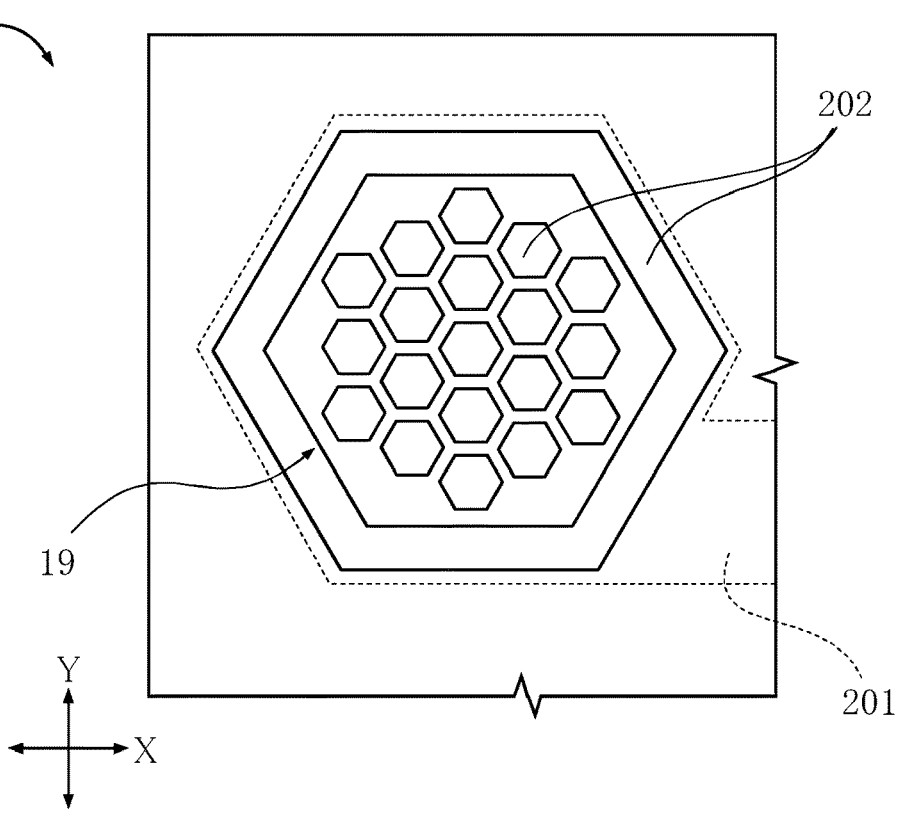
FIG. 55 is an enlarged bottom view showing a main part of a variation of the semiconductor device of FIG. 46.

Next, as shown in FIG. 51, the mask layer 801 is removed, and an insulation layer 102 made of $SiO_2$, for example, is formed. At this point, an insulation layer 192 is formed on the remaining portion 150 within the recess 140. Next, as shown in FIG. 52, a wiring section 20 and a bonding layer 32 are formed. In the present embodiment, a resin layer 22 is not provided between the insulation layer 102 and the wiring section 20. The steps of forming the wiring section 20 and the bonding layer 32 are the same as those in the first embodiment (see FIGS. 12 to 16). In the step of forming plating layers 20b, since the recess 140 is divided into a plurality of portions by the remaining portion 150, the plating layers 20b are formed respectively on the divided portions. After the plating layers 20b are formed on the divided portions, an additional plating layer 20b is formed to stride over the remaining portion 150. In this way, the plating layers 20b formed on the divided portions are connected to each other.

The subsequent steps of mounting a semiconductor element 31 and forming a sealing resin 4 are the same as those in the first embodiment (FIGS. 17 to 18). Next, as shown in FIG. 53, the substrate material 100 is ground from a back surface 120 thereof by mechanical grinding, for example. The grinding step is the same as in the first embodiment. As a result of grinding, an exposed surface 202b of a column 202 is formed, and a back surface 19b of the divider 19 is formed to be flush with the exposed surface 202b, as shown in FIG. 53. The subsequent steps of forming an insulation film 24, forming an electrode pad 26, and cutting are the same as those in the first embodiment (see FIGS. 20 to 21).

According to the present embodiment, in the step of forming the plating layers 20b during the manufacturing process, since the recess 140 is divided into a plurality of portions by the remaining portion 150, the plating layers 20b are formed respectively on the divided portions. After the plating layers 20b are formed on the divided portions, an additional plating layer 20b is formed to stride over the remaining portion 150. This facilitates the forming of the plating layers 20b in the recess 140, as compared to the case where the remaining portion 150 is not provided. In addition, a front surface 202c of the column 202 is flatter than in the case where the divider 19 is not provided. As a result, the amount of plating is reduced in the formation of the column 202, and the wiring section 20 to be formed on the front surface 11 of the substrate 1 can be made thinner.

In the present embodiment, the inner walls 141 of the through-hole 14 are not inclined to the thickness direction Z, and the resin layer 22 is not provided. However, the structure is not limited to such. The inner walls 141 of the through-hole 14 may be inclined to the thickness direction Z in the present embodiment. In such a case, the resin layer 22 may be formed in the same manner as in the first embodiment.

The shape of the divider 19 in plan view is not limited to the shape described above, and may be designed as appropriate. For example, a variation shown in FIG. 54, which is a main-part enlarged bottom view, is possible. In this variation, the column 202 is circular in plan view, and the divider 19 includes a plurality of (two in FIG. 54) annular dividing walls 19f that are arranged in a concentric pattern in plan view. Alternatively, a variation shown in FIG. 55, which is a main-part enlarged bottom view, is possible. In this variation, the column 202 is hexagonal in plan view, and the divider 19 may include a dividing wall having a honeycomb structure in plan view. Note that in FIGS. 54 and 55, the insulation film 24 and the electrode pad 26 are shown transparent for ease of understanding.

In the present embodiment, the substrate 1 and the divider 19 are formed by processing the same substrate material, namely the substrate material 100. However, the present disclosure is not limited thereto, and the divider 19 may be formed with a material different from the substrate material 100.

The semiconductor device and the method for manufacturing the same according to the present invention are not limited to those described in the foregoing embodiments. Various design changes can be made to the specific configurations of the elements of the semiconductor device and the method for manufacturing the same according to the present invention.

The invention claimed is:

1. A semiconductor device comprising:
a substrate having a front surface and a back surface that are opposite to each other in a thickness direction, the substrate being formed with a through-hole penetrating in the thickness direction;
a semiconductor element mounted on the front surface;
a front-surface wiring line formed on the front surface and electrically connected to the semiconductor element;
a column formed within the through-hole and electrically connected to the front-surface wiring line;
an electrode portion formed on a same side as the back surface and electrically connected to the column; and
a sealing resin covering the semiconductor element.

2. The semiconductor device according to claim 1, further comprising a resin-layer through portion interposed between the column and an inner wall of the through-hole, wherein the resin-layer through portion is in contact with the column, and includes an orthogonal surface orthogonal to the back surface.

3. The semiconductor device according to claim 2, wherein the through-hole becomes smaller in cross-sectional area parallel to the back surface toward the back surface.

4. The semiconductor device according to claim 2, wherein the resin-layer through portion is made of polyimide resin.

5. The semiconductor device according to claim 2, wherein the substrate is chiefly made of a monocrystal intrinsic semiconductor material, and the front surface has a crystal orientation of (100).

6. The semiconductor device according to claim 2, wherein the semiconductor element is a Hall element.

7. The semiconductor device according to claim 2, wherein the front-surface wiring line includes an underlying layer and a plating layer that are mutually laminated, and the plating layer is thicker than the underlying layer.

8. The semiconductor device according to claim 7, wherein the underlying layer includes a Ti layer and a Cu layer that are mutually laminated, and the plating layer is made of Cu.

9. The semiconductor device according to claim 2, wherein the substrate includes a side surface that is in contact with the front surface and the back surface, and the side surface is covered with the sealing resin.

10. The semiconductor device according to claim 2, wherein the semiconductor element includes an element back surface that faces toward the substrate, and a plurality of electrode bumps formed on the element back surface, and wherein the substrate is divided into regions by the sealing resin, and each of the regions includes a different one of a plurality of the front-surface wiring lines that are electrically connected to respective electrode bumps.

11. The semiconductor device according to claim 2, wherein the front surface of the substrate is formed with a recess, and wherein the semiconductor element is arranged within the recess.

12. The semiconductor device according to claim 2, wherein the front surface of the substrate is formed with a plurality of recesses, and the semiconductor element includes an element back surface that faces toward the substrate, and a plurality of electrode bumps formed on the element back surface, each of the electrode bumps being positioned in one of the recesses.

13. The semiconductor device according to claim 11, wherein the recess penetrates to the back surface.

14. The semiconductor device according to claim 2, wherein the semiconductor element includes an element front surface facing opposite from the substrate, and the element front surface is exposed by the sealing resin.

15. The semiconductor device according to according to claim 2, further comprising: a column that stands from the front-surface wiring line and is electrically connected thereto; and an inductor that is arranged on a tip of the column and electrically connected to the column.

16. The semiconductor device according to claim 2, wherein the substrate includes a base member and an insulation layer covering surfaces of the base member that are opposite to the back surface.

17. The semiconductor device according to claim 1, further comprising a divider that is located within the column and that divides a portion of the column on a same side as the back surface into a plurality of portions.

18. The semiconductor device according to claim 17, wherein the divider is made of a same material as the substrate.

19. A method for manufacturing a semiconductor device, the method comprising:
    forming a recess in a front surface of a substrate material having a back surface opposite to the front surface in a thickness direction;
    forming a resin layer including a resin-layer through portion that is disposed within the recess and has an orthogonal surface orthogonal to the back surface;
    forming a wiring section including a column that fills a space surrounded by the orthogonal surface;
    mounting a semiconductor element such that the semiconductor element is electrically connected to the wiring section;
    forming a sealing resin to cover the semiconductor element; and
    exposing a portion of the column by removing a portion of the substrate material with respect to the back surface.

20. The method for manufacturing a semiconductor device according to claim 19, wherein the forming the resin layer comprises: applying a photosensitive resin material, which ultimately becomes the resin layer, to all surfaces of the substrate material on a front surface side; and removing a portion surrounded by the orthogonal surface by exposure and development.

21. The method for manufacturing a semiconductor device according to claim 19, wherein the forming the wiring section comprises: forming an underlying layer on the substrate material at a front surface side by sputtering; forming a mask layer on the underlying layer by photolithography, the mask layer being for forming a plating layer; and forming the plating layer in contact with the underlying layer by electroplating.

22. The method for manufacturing a semiconductor device according to claim 19, further comprising additional steps after exposing the portion of the column, wherein the additional steps comprise forming an insulation film by photolithography, the insulation film covering a back surface facing opposite from the front surface and having an opening surrounding an exposed surface of the column; and forming, in the opening, an electrode pad to be in contact with the exposed surface of the column by electroless plating.

* * * * *